United States Patent
Horii et al.

(10) Patent No.: US 7,511,985 B2
(45) Date of Patent: Mar. 31, 2009

(54) SEMICONDUCTOR MEMORY DEVICE

(75) Inventors: Shinji Horii, Fukuyama (JP); Shinichi Sato, Fukuyama (JP); Satoru Yamagata, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 150 days.

(21) Appl. No.: 11/785,311

(22) Filed: Apr. 17, 2007

(65) Prior Publication Data

US 2007/0285972 A1    Dec. 13, 2007

(30) Foreign Application Priority Data

May 18, 2006    (JP)    ............................. 2006-138592

(51) Int. Cl.
  *G11C 11/00*    (2006.01)
(52) U.S. Cl. .................. 365/148; 365/158; 365/171
(58) Field of Classification Search .................. 365/148, 365/158, 171, 173
  See application file for complete search history.

(56) References Cited

U.S. PATENT DOCUMENTS

| 7,002,837 B2* | 2/2006 | Morimoto .................... 365/148 |
| 7,057,922 B2* | 6/2006 | Fukumoto .................... 365/158 |
| 2004/0114438 A1 | 6/2004 | Morimoto |
| 2004/0130939 A1 | 7/2004 | Morikawa |

FOREIGN PATENT DOCUMENTS

| JP | 2004-185754 | 7/2004 |
| JP | 2004-185755 | 7/2004 |

OTHER PUBLICATIONS

S.Q. Liu et al.: "Electric-pulse-induced reversible resistance change effect in magnetoresistive films," *Applied Physics Letter*, 2000 American Institute of Physics, vol. 76, No. 19, pp. 2749-2751, May 8, 2000.

* cited by examiner

*Primary Examiner*—Anh Phung
*Assistant Examiner*—Hien N Nguyen
(74) *Attorney, Agent, or Firm*—Nixon & Vanderhye, P.C.

(57) ABSTRACT

A semiconductor memory device comprises a array of memory cells arranged in a matrix, each memory cell connected to one end of a variable resistor element where the electric resistance is shifted from the first state to the second state by applying the first writing voltage and from the second state to the first state by applying the second writing voltage, and the source or drain of the selecting transistor. The second writing time for the second writing action of shifting the electric resistance of the variable resistor element from the second state to the first state is longer than the first writing time of shifting the same reversely. The second number of the memory cells subjected to the second writing action at once is greater than the first memory cell number subjected to the first writing action at once, and at least the second number is two or more.

8 Claims, 17 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2006-138592 filed in Japan on 18 May, 2006, the entire contents of which are hereby incorporated by reference.

BACKGROUND OF THE INVENTION

1. Field of the Invention

The present invention relates to a semiconductor memory device which has an array of memory cells arranged in rows and columns, each memory cell comprising a variable resistor element accompanied with a selecting transistor for storing a data by changing its electrical resistance in response to application of a voltage.

2. Description of the Related Art

Such a nonvolatile semiconductor memory device, namely a flash memory, has widely been utilized as a small-sized, mass data recording medium in a wide range of applications including a computer, a communications apparatus, a measuring apparatus, an automated control apparatus, and a house-hold or personal appliance. As inexpensive and larger in the storage size, the nonvolatile semiconductor memory device is now higher in the market demand. The reason may be that the semiconductor memory device is capable of electrically erasing and programming a data and nonvolatile for holding the data when it has been disconnected from the power source, hence functioning as a memory card arranged easily portable or a data storage or program storage provided in a mobile telephone or any other apparatus for saving nonvolatile data as the initial settings.

One type of the memory cells for use in a flash memory is known an ETOX memory cell. As shown in FIG. 15, an ETOX flash memory cell denoted by 8 has a source 3 and a drain 2 provided in a semiconductor substrate 1 thereof, which is arranged of a conducting type opposite to that of the semiconductor substrate 1, and a gate insulating layer 4 provided between the source and the drain. A floating gate 5, an interlayer insulating layer 6, and a control gate 7 are provided on the gate insulating layer 4.

According to the action principle of the flash memory cell 8, a source voltage Vs at a low level (for example, 0V), a drain voltage Vd at a high level (for example, 6 V), and a high control voltage Vpp (for example, 12 V) are commonly applied to the source 3, the drain 2, and the control gate 7, respectively for starting a data programming action. In response, hot electrons and hot holes are produced between the drain and the source. The hot holes flow as a substrate current into the substrate while the hot electrons are injected to the floating gate, whereby the threshold voltage monitored from the control gate 7 in the transistor will increase.

For the reading action, the source voltage Vs at a low level (for example, 0 V), the drain voltage Vd at a slightly higher level than the source voltage (for example, 1 V), and the control voltage Vpp at 5 V are applied to the source 3, the drain 2, and the control gate 7, respectively. At the time, the programmed memory cell and the not programmed memory cell are different from each other in the threshold voltage and their current flowing between the source and the drain will be unequal. Accordingly, it can be judged by detecting a difference between the two currents whether the memory cell to be examined has been programmed or not. Assuming that the data is "1" and "0" when the current flowing between the source and the drain is greater and smaller respectively than a reference level, the programming and reading of two-level data can be enabled.

For the erasing action, the source voltage Vs at a high level (for example, 12 V) and the control voltage at a low level (or example, 0 V) are applied to the source 3 and the control gate 7 respectively while the drain remains at a floating state. Accordingly, a Fowler-Nordheim current runs across a tunnel oxide layer 4 between the floating gate and the source, permitting the electrons to be drawn from the floating gate 5 and thus declining the threshold voltage monitored from the control gate 7 in the transistor.

This is followed by a verifying action which is a sort of the read action for examining whether the memory cell subjected to the programming action or erasing action according to the action principle is held higher or lower than a relevant threshold voltage. For verifying the completion of the programming action, the threshold voltage of the memory cell to be subjected to the programming action is compared with that of a first reference cell where the threshold voltage (Vthp) is at higher level (for example, 5.3 V). When its threshold voltage is higher than the threshold voltage (Vthp) of the first reference cell, the memory cell is judged that it has been subjected to the programming action. For verifying the completion of the erasing action, the threshold voltage of the memory cell to be subjected to the erasing action is compared with that of a second reference cell where the threshold voltage (Vthe) is at lower level (for example, 3.1 V). When its threshold voltage is lower than the threshold voltage (Vthe) of the second reference cell, the memory cell is judged that it has been subjected to the erasing action.

FIG. 16 illustrates an arrangement of the flash memory where the memory cells 8 having the structure shown in FIG. 15 are arrayed in rows and columns and connected at the source to a common source line SL thus to form a memory cell array 10 accompanied with peripheral circuits.

The memory cell array 10 includes an m number of word lines WL1 to WLm extending along the rows and an n number of bit lines BL1 to BLn extending along the columns. The memory cells 8 at each row are connected at the control gate to a common word line while the memory cells 8 at each column are connected at the drain to a common bit line. All the memory cells 8 in the memory cell array 10 are connected at the source to the common source line SL. A row decoder 11 is connected to one end of each of the word lines WL1 to WLm while a column decoder 12 is connected to one end of each of the bit lines BL1 to BLn. The source line SL is connected with an erase circuit 13.

The row decoder 11 is arranged to receive a row address signal and an erase signal while the column decoder 12 is arranged to receive a data signal and a column address signal. The erase circuit 13 is arranged to receive the erase signal. It is assumed that the memory cell array 10 includes the m number of word lines WL1 to WLm (for example, m=2048) and the n number of bit lines BL1 to BLn (for example, n=512), and the n number of the memory cells 8 are connected at the control gate to each word line. Accordingly, the memory cell array has a memory size of m×n bits (for example, 1 Mbits). For the erasing action, the erase signal is applied to the erase circuit 13 and the row decoder 11. More particularly, the high voltage Vpp is applied to the sources of all the memory cells 8 in the matrix shown in FIG. 16 from the source line SL while all the word lines WL1 to WLm remain at the low voltage (for example, 0 V) and all the memory cells 8 can thus be erased at once.

In an actual practice, the erasing action is carried out at a block, for example, 64 Kbytes, which is relatively a large unit of data. However, the memory cells in each block to be erased may remain at the programmed state and the erased state. It is hence necessary for conducting the erasing action to use such an intricate algorithm as shown in FIG. 17.

The procedure of the erasing action shown in FIG. 17 will be explained. The erasing action starts with all the memory cells in one target block shifted to the programmed state by a common programming (channel hot electron (CHE) writing) technique (Step S1). Then, the verifying action follows for examining whether or not the threshold voltage of the memory cells subjected to the programming action at Step S1 is equal to or higher than 5.5 V, for example, in each 8-bit unit (Step S2). When the threshold voltage of the memory cells is not equal to or higher than 5.5 V, the procedure returns back to Step S1 and repeats its programming action over the memory cells. When the threshold voltage of all the memory cells is equal to or higher than 5.5 V, the procedure advances to Step S3. At Step S3, the erase voltage of a pulsed form is applied with the entire block for drawing the electrons to the source side and thus declining the threshold voltage to erase the memory cells. It is then examined at Step S4 for the erase verifying action whether or not the threshold voltage of all the memory cells in the target block is equal to or lower than 3.5 V. When the threshold voltage of the memory cells is not equal to or lower than 3.5 V, the procedure returns back to Step S3 and repeats the erasing action. When the threshold voltage is equal to or lower than 3.5 V, the procedure is terminated.

As understood from the procedure of the erasing action shown in FIG. 17, a profile of distribution of the threshold voltages after the erasing action appears as tight as possible or narrowed in the range while all the memory cells have been shifted to the programmed state at Step S1 for eliminating the over-erased state of the memory cells (where the threshold voltage is equal to or lower than 0 V). The programming action may be conducted by a common programming technique over, for example, eight of the memory cells at once. Assuming that the time required for programming one memory cell is two microseconds, the overall programming action at Step S1 takes 131 milliseconds as is denoted by Equation 1.

$$2 \text{ }\mu\text{s} \times 64 \text{ Kbytes} \div 8 \text{ bits} = 131 \text{ ms} \quad (1)$$

The time required for the programming action is about 20% when the overall time required for the erasing action is 600 milliseconds. Also, assuming that the time required for reading each memory cell is 100 nanoseconds, the verifying action on the 8-bit basis at Step S2 is 6.6 milliseconds as denoted by Equation 2.

$$100 \text{ ns} \times 64 \text{ Kbytes} \div 8 \text{ bits} = 6.6 \text{ ms} \quad (2)$$

Furthermore, the application of the pulsed erase voltage at Step S3 takes substantially 300 milliseconds.

In the procedure for the erasing action shown in FIG. 17, the time required for applying the pulsed erase voltage may be minimized by increasing the voltage applied to the source. When the source voltage is increased, the tunnel current between bands will be large enough to trap the holes in the tunnel oxide layer thus declining the reliability. Since the increase of the source voltage is unfavorable, the erasing action will hardly be speeded up.

One of the mostly known appliances equipped with the flash memories is a mobile telephone. As mobile telephones have significantly been demanded for being minimized in the dimensions, their power sources are strictly limited in the capacity and the flash memories are much preferable of a nonvolatile type which needs no backup power source for holding data during the considerable length of standby period. In addition, as the flash memories have been increased in the storage size, they allow a variety of application programs and data to be saved and selectively used thus contributing to the multi-functional performance of every mobile telephone.

Meanwhile, such known nonvolatile semiconductor memory devices including flash memories have been improved in the technology, for example, as disclosed in U.S. Pat. No. 6,204,139 by S. Liu, A. Ignatiev, et al. at the University of Houston, U.S.A. or in the report "Electric-pulse-inducted reversible Resistance change effect in magnetoresistive films" by Liu, S. Q, et al., Applied Physics Letter, Vol. 76, pp. 2749-2751, in 2000, where the pulsed voltage is applied to a perovskite material, which has an effect of super magneto-resistance, to vary the electric resistance positively and negatively. They are remarkable approaches that the resistance is varied on the order of a few digits under no presence of a magnetic field in the room temperature with the use of a perovskite material which provides a super magneto-resistive phenomenon. One of the nonvolatile, resistive memory devices where variable resistor elements utilizing the magneto-resistive phenomenon are arrayed is a resistance random access memory (RRAM) which is much lower in the power consumption than an MRAM as requiring no magnetic field and can thus highly be integrated and minimized in the overall size with much ease. In particular, as RRAM is significantly wider in the dynamic range of resistance change than MRAM, it can provide an advantageous function of multi-level storage. The actual device structure of RRAM is as extremely simple as having a lower electrode material, a perovskite metal oxide, and an upper electrode material layered from the below in this order along the vertical. More specifically in the structure disclosed in the above described U.S. Pat. No. 6,204,139, the lower electrode material is a layer of yttrium barium copper oxide (YBCO), $YBa_2Cu_3O_7$, deposited on a mono-crystalline substrate of lanthanum aluminum oxide (LAO), $LaAlO_3$, the perovskite metal oxide is a layer of crystalline praseodymium calcium manganese oxide (PCMO), $Pr_{1-X}Ca_XMnO_3$, and the upper electrode material is an Ag layer deposited by sputtering. It is reported that the memory device of that type is operable with a positive or negative pulsed voltage at 51 V applied between the upper electrode and the lower electrode thus to change the resistance. Since its action of changing the resistance positively and negatively (referred to as a "switching action" hereinafter) permits a change in the resistance to be read out, the nonvolatile semiconductor memory device becomes novel.

More particularly, the structure of the nonvolatile semiconductor memory device comprises an array of memory cells, each cell having a variable resistor element provided in the form of a PCMO layer or the like and arranged of which the electric resistance is varied for saving a data, arranged in a matrix of rows and columns thus to form a memory cell array and peripheral circuits provided about the memory cell array for controlling the action of programming, erasing, and reading the data over each memory cell.

The structure of the memory cell having a variable resistor element may be implemented by a series circuit where the variable resistor element is connected in series with its selecting transistor or by simply a variable resistor. The former memory cell is called an 1T/1R type while the latter memory cell is called an 1R type. The 1T/1R type memory cell is further classified into two forms where the bit line is connected to either the variable resistor element or the selecting transistor (for example, as disclosed in Japanese Patent Laid-open Publication No. 2004-185754 or No. 2004-185755).

For selecting the memory cell to be read, programmed, or erased in the 1T/1R type memory cell array, bias voltages are applied to the selected word line and the selected bit line to switch on the selecting transistor in the selected memory cell connected to both the selected word line and the selected bit line. More specifically, the variable transistor element in the selected memory cell is supplied with a reading current, a programming current, or an erasing current. This allows the 1T/1R type memory cell to be accompanied with peripheral circuits which are equal to those in a conventional flash memory.

It is desired that in view of application programs and data having significantly been increased in the overall size, the conventional nonvolatile semiconductor memory device is favorably systematized for upgrading its functions and correcting bugs through writing the software saved therein. The conventional types of flash memory however have a drawback that the action of writing the data consumes a considerable length of time and remains limited in the data size to be handled. Also, another drawback is to spare an extra storage area for buffering files, hence making the action of writing the data extremely complicated in steps.

The conventional nonvolatile semiconductor memory device or flash memory may be replaced by a resistive, nonvolatile memory including a variable resistor element in order to speed up the action of writing (erasing and programming) the data. The theory of writing the data of the variable resistor element (using a change in the electric resistance) is however not equal to that of the conventional nonvolatile semiconductor memory device or flash memory (involving injection and drawing out of electrons across the floating gate). Accordingly, even when the algorithm for writing employed in the conventional flash memory is applied to the resistive nonvolatile memory including the variable resistor element, the speeding up expected for each memory cell will not necessarily be expected in the whole device.

SUMMARY OF THE INVENTION

The present invention has been developed in view of the above aspects and its object is to provide a semiconductor memory device which can write the data in an array of memory cells including variable resistor elements rapidly and certainly as is higher in the freedom of functioning.

For achievement of the object of the present invention, a semiconductor memory device is provided having a memory cell array comprising a plurality of memory cells arranged in rows and columns, each memory cell comprising a variable resistor element of a two-port structure capable of storing a data by shifting its electric resistance from a first state to a second state when a first writing voltage is applied to both ends of the variable resistor element and shifting its electric resistance from the second state to the first state when a second writing voltage is applied to both ends of the variable resistor element and a selecting transistor connected at either its source or its drain to one end of the variable resistor element, in which, as a first feature, the memory cell has such a writing time characteristic that a second writing time required for shifting the electric resistance from the second state to the first state by applying the second writing voltage is longer than a first writing time required for shifting the electric resistance from the first state to the second state by applying the first writing voltage, and a second number of the memory cells subjected at once to a second writing action of shifting the electric resistance from the second state to the first state is greater than a first number of the memory cells subjected at once to a first writing action of shifting the electric resistance from the first state to the second state when some or entire of the memory cells in the memory cell array are selected, and at least the second number of the memory cells is two or more between the first number and the second number of the memory cells.

The semiconductor memory device of the first feature allows the second number of the memory cells subjected at once to the second writing action to be two or more and greater than the first number of the memory cells subjected at once to the first writing action, whereby the second writing action which takes a longer duration of time can be applied to a more number of the memory cells than that for the first writing action thus to efficiently shorten the writing time per memory cell of the second writing action which takes longer than the first writing action. As the result, the writing time for writing data through the first writing action and the second writing action over a desired group of the memory cells in the memory cell array can be minimized at effectiveness.

As described above, the conventional nonvolatile semiconductor memory device such as a flash memory is replaced by a resistive nonvolatile memory device employing the variable resistor elements for speeding up the action of writing data. The variable resistor element is asymmetrical in the profile of time required for shifting the electric resistance from one of the two resistance states to the other (the first writing time and the second writing time), depending on the polarity of the voltage applied to both ends of the variable resistor element. The asymmetrical profile between the two, positive and negative, polarities may result from the fact that the lower and upper electrodes which sandwich a variable resistor to form the variable resistor element are different from each other in either the material or the area size, that the variable resistor is not uniform in the property along the thickness, or that the interface between the upper electrode and the variable resistor and the interface between the lower electrode and the variable resistor are different due to variations of the production process. It is hence hardly defined that the each of the first and second states of the electric resistance represents either the low or high resistance state. For example, when the action of shifting the electric resistance of the variable resistor element to the low resistance state which has simply been designated to represent the erased state of the flash memory cell where the threshold voltage is low (i.e., the on resistance is low) is conducted at once over a group of the memory cells, it may not significantly contribute to speed up the overall writing action.

Since the flash memory permits its memory cells to be erased not one by one, its erasing action is conducted at once. In a resistive nonvolatile memory device, the first writing action and the second writing action can be conducted each of the memory cells, thus allowing a desired group of the memory cells to be written to be selectively subjected to the writing action. Particularly, the inventive device needs not to enlarge a unit of data to be written and can thus speed up efficiently the action of writing the data of a minimum unit.

The semiconductor memory device according to the present invention may have a second feature in addition to the first feature that a memory cell number rate determined by dividing the second number of the memory cells by the first number of the memory cells is set equal to or greater than a writing time rate determined by dividing the second writing time by the first writing time.

During the action of the semiconductor memory device of the second feature for writing the data in a group of the memory cells in the memory cell array through the first writing action and the second writing action, the second writing action which is longer in the time consumption is effectively decreased in the number of conducting times. Accordingly, the ratio of the time consumption of the second writing action to the overall duration of time required for completing the writing action can be declined to substantially not greater than a half, thus effectively minimizing the overall duration of time.

The semiconductor memory device according to the present invention may have a third feature in addition to the first or second feature that each of the first number of the memory cells and the second number of the memory cells is two or more.

The semiconductor memory device of the third feature allows the writing time for a unit number of the memory cells to be further minimized.

The semiconductor memory device according to the present invention may have a forth feature in addition to any of the first to third features that the absolute value of the first writing voltage is greater than the absolute value of the second writing voltage.

The semiconductor memory device of the fourth feature allows the absolute value of the second writing voltage required for conducting the second writing action where the number of the memory cells to be written at once is greater to remain not greater than the absolute value of the first writing voltage, thus minimizing the power consumption at the second writing action over the second number of the memory cells.

The semiconductor memory device according to the present invention may have a fifth feature in addition to the fourth features that the memory cell array includes a number of word lines extending along the rows and a number of bit lines extending along the columns, the gate of the selecting transistor in each of the memory cells arranged along one row is connected with a common word line while the variable resistor element in each of the memory cells arranged along one column is connected at one end not connected to either the source or drain of the selecting transistor with a common bit line or either the source or drain of the selecting transistor not connected to one end of the variable resistor is connected with the common bit line, the selecting transistor is an N channel MOSFET, and a positive voltage based on a level at either the source or drain of the selecting transistor not connected to the one end of the variable resistor element in the memory cell to be written is applied to the other end of the variable resistor element not connected to either the source or drain of the selecting transistor in the memory cells to be written when the first writing voltage is applied to the memory cell to be written.

The semiconductor memory device of the fifth feature allows the positive voltage to be applied to the variable resistor element in the memory cell, whereby the voltage to be supplied to both ends of the memory cell to be written can be received by both ends of the variable resistor element with no limitation of a declined level determined by subtracting the threshold level from the gate voltage level of the selecting transistor. More particularly, the first writing voltage of which the absolute value is greater than that of the second writing voltage can thus be efficiently applied to the variable resistor element, hence ensuring the efficiency of the first writing action.

The semiconductor memory device according to the present invention may have a sixth feature in addition to the fifth feature that the first writing voltage and the second writing voltage are different to each other in the polarity and a negative voltage based on a level at either the source or drain of the selecting transistor not connected to the one end of the variable resistor element in the memory cell to be written is applied to the other end of the variable resistor element not connected to either the source or drain of the selecting transistor in the memory cell to be written when the second writing voltage is applied to the memory cell to be written.

The semiconductor memory device of the sixth feature allows the first writing voltage of which the absolute value is greater than the second writing voltage to be applied to the variable resistor element with no limitation of a declined level determined by subtracting the threshold level from the gate voltage level of the selecting transistor when the first writing voltage and the second writing voltage which are different to each other in the polarity are applied, and also with the second writing voltage of which the absolute value is not greater than that of the first writing voltage and which is at the declined level determined by subtracting the threshold level from the gate voltage level of the selecting transistor. Accordingly, a greater level than the absolute value of the second writing voltage may have to be applied to the memory cell. Since the absolute value of the second writing voltage is not greater than that of the first writing voltage, there is no significant difference in the writing voltage applied to both ends of the memory cell between the first writing action and the second writing action. As the result, the first writing action and the second writing action can equally be conducted through applying the same writing voltage to both ends of the memory cell with either the variable resistor element or the selecting transistor modified to a corresponding design arrangement.

The semiconductor memory device according to the present invention may have a seventh feature in addition to any of the foregoing features that the first writing action is preliminarily conducted for setting the electric resistance to the second state before the memory cells to be written are subjected simultaneously to the second writing action based on a writing control procedure provided in advance.

The semiconductor memory device of the seventh feature allows the resistance level at the second state of the electric resistance in the memory cell to be subjected to the second writing action to stay within a narrower range. Accordingly, the resistance level at the second state of the electric resistance in the memory cell after the second writing action remains within a narrower range. As the resistance levels at both the first and second states of the electric resistance in the memory cell remain within a narrower range after the completion of the writing action, the reading action can be improved in the operable margin and the operating speed.

The semiconductor memory device according to the present invention may have an eighth feature in addition to the seventh features that, the second number of the memory cells to be subjected at once to the second writing action is subjected to the reading action for retrieving the memory cells of which the electric resistance is not at the second state before the first writing action is preliminarily conducted and then, the retrieved memory cells are preliminarily subjected to the first writing action based on a writing control procedure provided in advance.

The semiconductor memory device of the eighth feature allows a number of the memory cells to be preliminarily subjected to the first writing action to be limited only the number of the memory cells required for the first writing action. Accordingly, as the first writing action conducted preliminarily is decreased in the number of operating times, the duration of time required for preliminarily conducting the first writing action can be shortened thus minimizing the overall writing time.

DETAILED DESCRIPTION OF THE INVENTION

Some embodiments of a semiconductor memory device according to the present invention (referred to as an "inventive device" hereinafter) will be described referring to the relevant drawings.

First Embodiment

Figure 1:
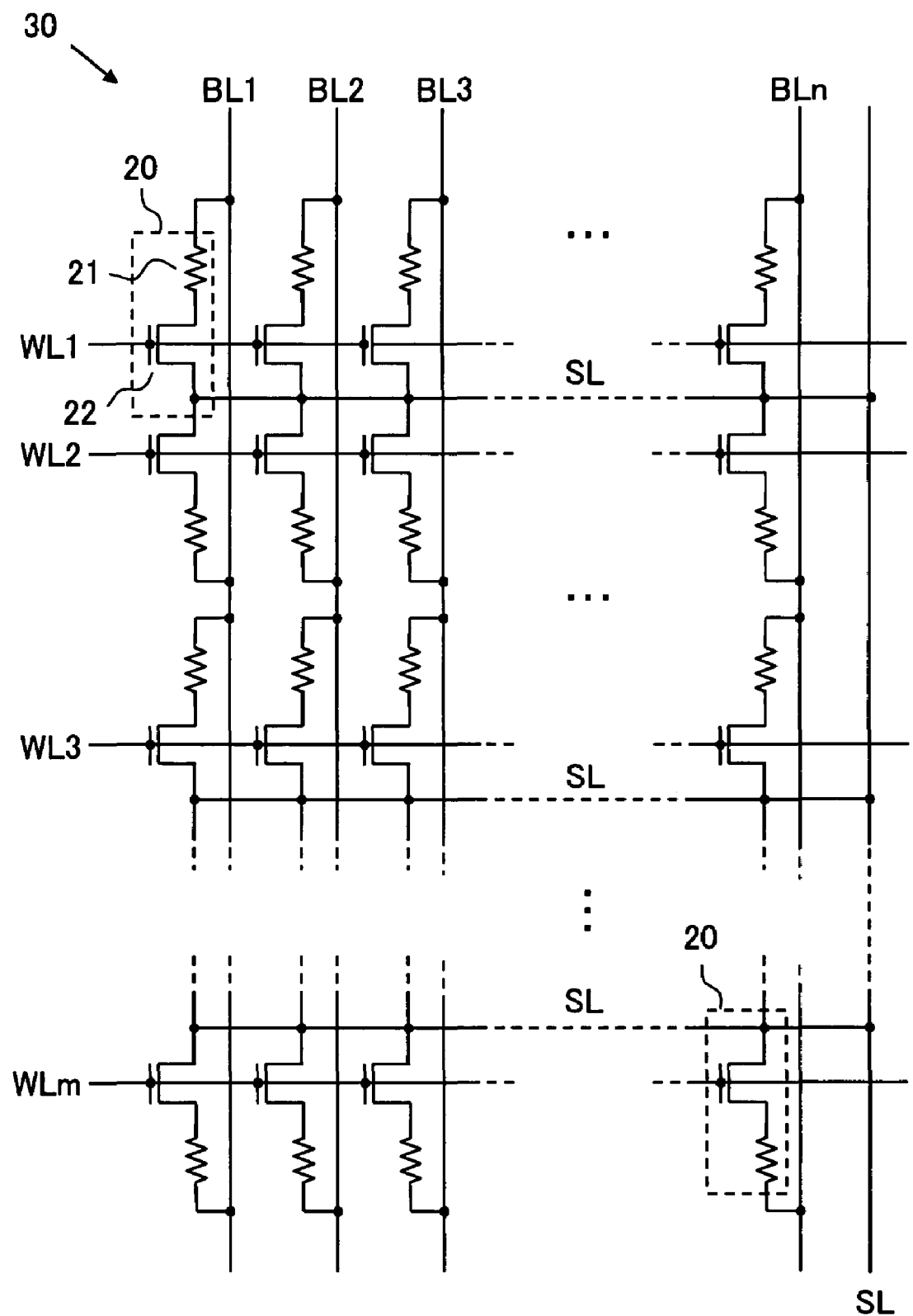
FIG. 1 is a circuitry diagram schematically showing an arrangement of memory cell array in a semiconductor memory device of one embodiment according to the present invention.

The inventive device comprises one or more memory cell arrays 30, each memory cell array having an array of memory cells 20 arranged in rows and columns, an m number of word lines WL1 to WLm arranged along the rows and an n number of bit lines BL1 to BLn arranged along the columns for selecting one or more memory cells, and a number of source lines SL arranged along the rows, as shown in FIG. 1. The source lines SL shown in FIG. 1 extend in parallel with the word lines WL1 to WLm along the rows and are connected at one end to a common line at the outside of the memory cell array 30. Alternatively, each source line SL may be accompanied with two adjacent word lines WL or arranged to extend along the columns but not the rows. Moreover, the source lines SL may be provided separately in the memory cell array 30 and arranged for selecting one or more memory cells in conjunction with the word lines and the bit lines.

The memory cell array 30 is not limited to the arrangement of equivalent circuit form shown in FIG. 1 but may comprise simply an array of memory cells 20, each memory cell including a variable resistor element 21 and a selecting transistor 22, which are connected to word lines, bit lines, and source lines in any applicable circuitry arrangement which is not defined by the inventive device.

The memory cell 20 in this embodiment has a variable resistor element 21 connected at one end to either the source or the drain of a selecting transistor 22, thus forming a series circuit. The other end of the variable resistor element 21 is connected to one of the bit lines BL1 to BLn while either the drain or the source of the selecting transistor 22 is connected to the source line SL. The gate of the selecting transistor 22 is connected to one of the word lines WL1 to WLm. The variable resistor element 21 is a two-port nonvolatile memory element of which its electric resistance shifts from the first state to the second state by applying a first writing voltage to its both ends and returns from the second state to the first state by applying a second writing voltage to its both ends. The selecting transistor 22 is of a MOSFET type which is equal to MOSFETs used in peripheral circuits of the memory cell array 30, described later, more specifically, an N channel MOSFET type of which the conduction type is N at both the source and the drain.

Figure 2:
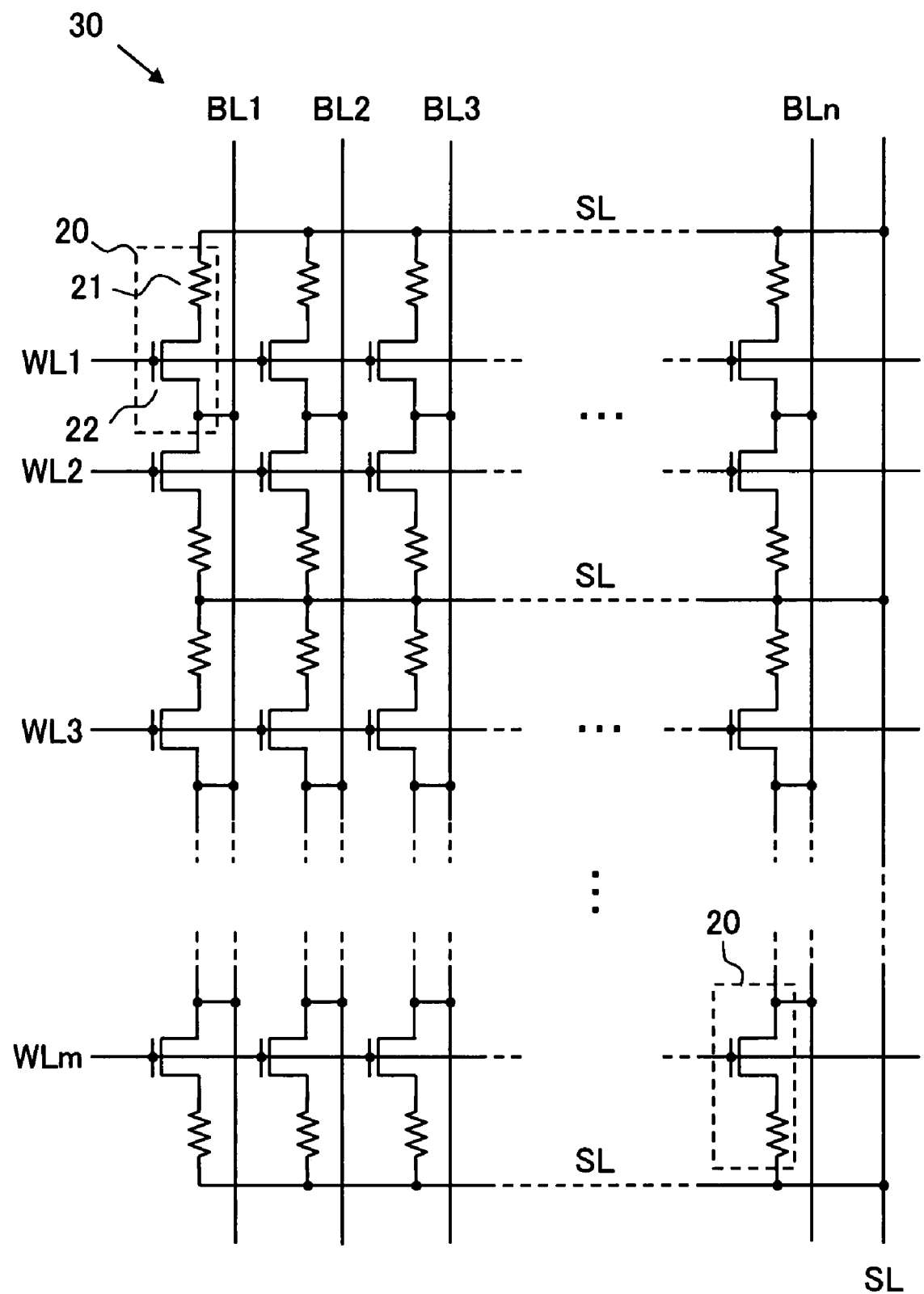
FIG. 2 is a circuitry diagram schematically showing another arrangement of memory cell array in the semiconductor memory device of one embodiment according to the present invention.

In the circuitry arrangement of FIG. 1, the variable resistor element 21 is connected at the other end to one of the bit lines BL1 to BLn while the selecting transistor 22 is connected at the source or drain to the source line SL. Alternatively, the variable resistor element 21 may be connected at the other end to the source line SL while the selecting transistor 22 is connected at the source or drain to one of the bit lines BL1 to BLn, as shown in FIG. 2.

Figure 3:
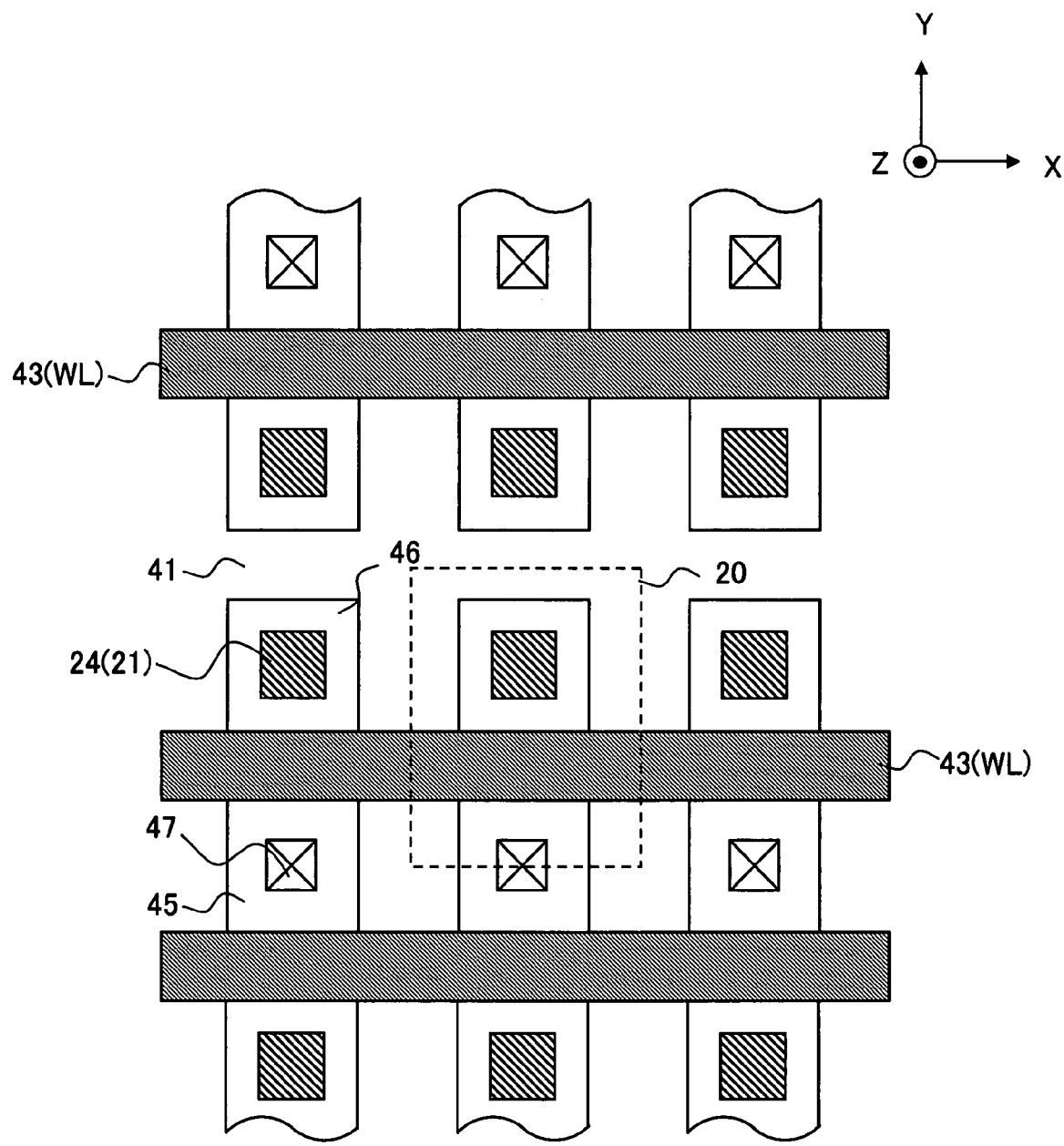
FIG. 3 is a general plan view schematically showing memory cells and their memory cell array in the semiconductor memory device of one embodiment according to the present invention.
Figure 4:
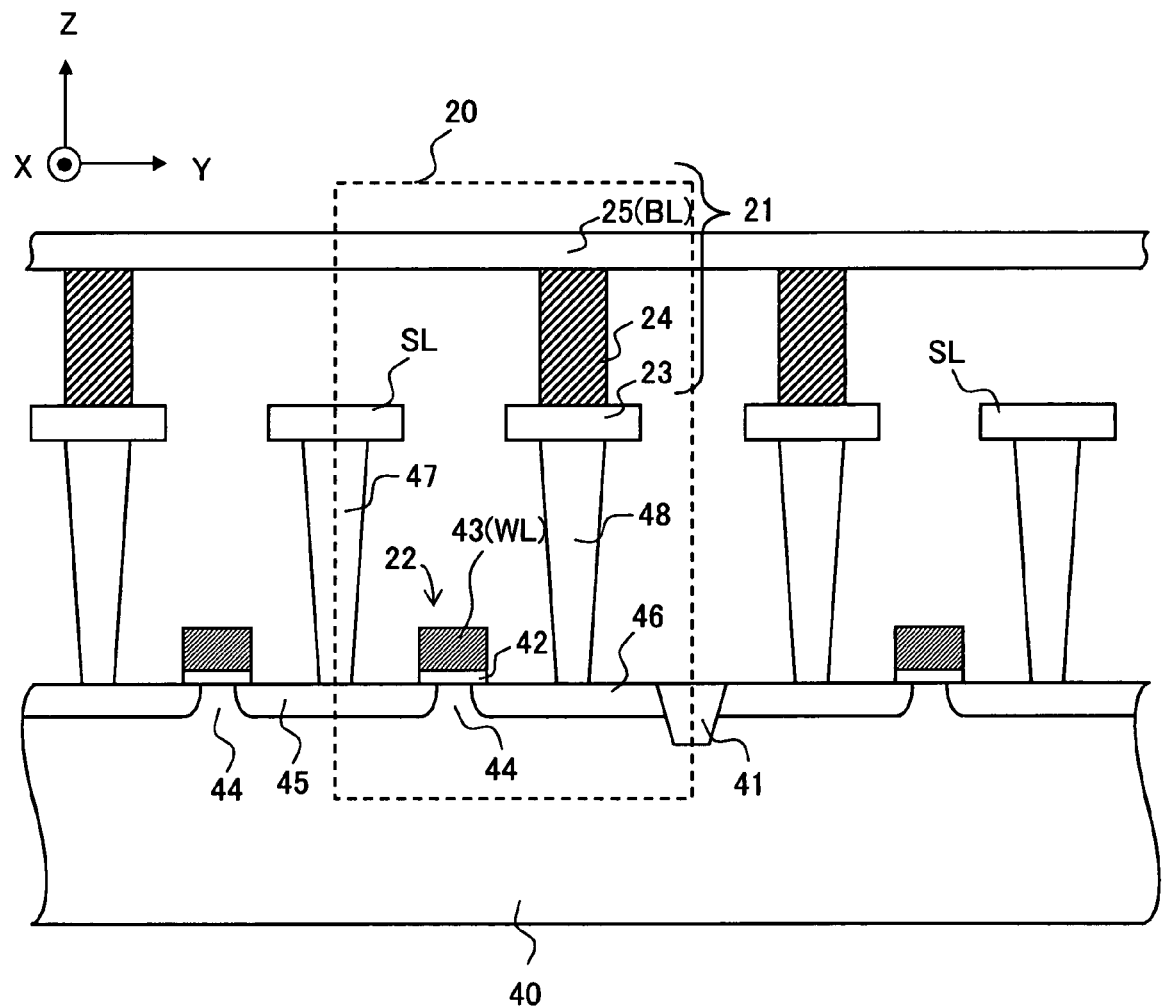
FIG. 4 is a general cross sectional view schematically showing the memory cells and the memory cell array in the semiconductor memory device of one embodiment according to the present invention.

FIGS. 3 and 4 schematically illustrate a plan view and a cross sectional view of the memory cells 20 of FIG. 1 in the memory cell array 30. Expediently denoted by X, Y, and Z in FIGS. 3 and 4 are directions along the rows, along the columns, and vertical to the surface of the semiconductor substrate respectively. The cross sectional view of FIG. 4 is taken along the line Y-Z of FIG. 3. As shown in FIGS. 3 and 4, a P type semiconductor substrate (or P type well) 40 has active areas thereof isolated at least partially by an element separating layer 41 which may be formed by an shallow trench isolation (STI) technique or the like. As a gate insulating layer 42 is deposited at least partially on the active area, it is at least partially covered with a gate electrode 43 of, e.g., polycrystalline silicon. Also, a channel region 44 is provided beneath the gate insulating layer 42 as sandwiched between two impurity diffused layers 45 and 46 of which the conduction type (N) is different from that of the semiconductor substrate 40. The two impurity diffused layers 45 and 46 form a drain and a source respectively of the selecting transistor 22. As the gate electrodes 43 of the selecting transistors 22 in the memory cells are connected to one another along the row direction (denoted by X), they constitute the word line WL (WL1 to WLm).

The impurity diffused layer 45 is connected to the source line SL extending along the row direction (denoted by X) by a contact hole 47 provided above the layer 45 by filling the interior of an interlayer insulator with a conductive material. The other impurity diffused layer 46 is connected to the lower electrode 23 of the variable resistor element 21 by a similar contact hole 48. The upper electrodes 25 of the variable resistor elements 21 extend along the column direction (denoted by Y) thus to form the bit line BL (BL1 to BLn). In the plan view of FIG. 3, the source line SL extending along the row direction (denoted by X) and the bit line BL (BL1 to BLn) extending along the column direction (denoted by Y) are not shown for clearly illustrating the lower part of the structure.

It is common that the variable resistor element 21 has a three-layer structure comprising the lower electrode 23, the variable resistor 24, and the upper electrode 25 provided in layers. The variable resistor element 21 is not limited to a shape or a material of its variable resistor 24 so long as having the function that the electric resistance shifts from the first state to the second state by applying the first writing voltage to its both ends and returns from the second state to the first state by applying the second writing voltage to its both ends. The variable resistor 24 may be selected from a group of perovskite oxides including manganese, for example, $Pr_{(1-x)}Ca_xMnO_3$, $La_{(1-x)}Ca_xMnO_3$, $La_{(1-x-y)}Ca_xPb_yMnO_3$ (where x<1, y<1, and x+y<1), $Sr_2FeMoO_6$, $Sr_2FeWO_6$, more particularly a group of manganese oxides, for example, $Pr_{0.7}Ca_{0.3}MnO_3$, $La_{0.65}Ca_{0.30}MnO_3$, and $La_{0.65}Ca_{0.175}Pb_{0.175}MnO_3$, and a group of oxides or oxynitrides of a metallic element such as titanium, nickel, vanadium, zirconium, tungsten, cobalt, zinc, iron, or copper. The variable resistor 24 may also be implemented by a structure of the manganese contained perovskite oxide or metal oxide or oxynitride sandwiched from above and below by metallic layers of aluminum, copper, titanium, nickel, vanadium, zirconium, tungsten, cobalt, zinc, or iron, conductive oxide layers, nitride layers, or oxynitride layers including one of those metals. Although the variable resistor 24 is not limited to a shape or a material so long as having the function that the electric resistance shifts from the first state to the second state by applying the first writing voltage to its both ends and returns from the second state to the first state by applying the second writing voltage to its both ends, its material is preferably selected from the above described examples for ensuring the function.

Figure 5:
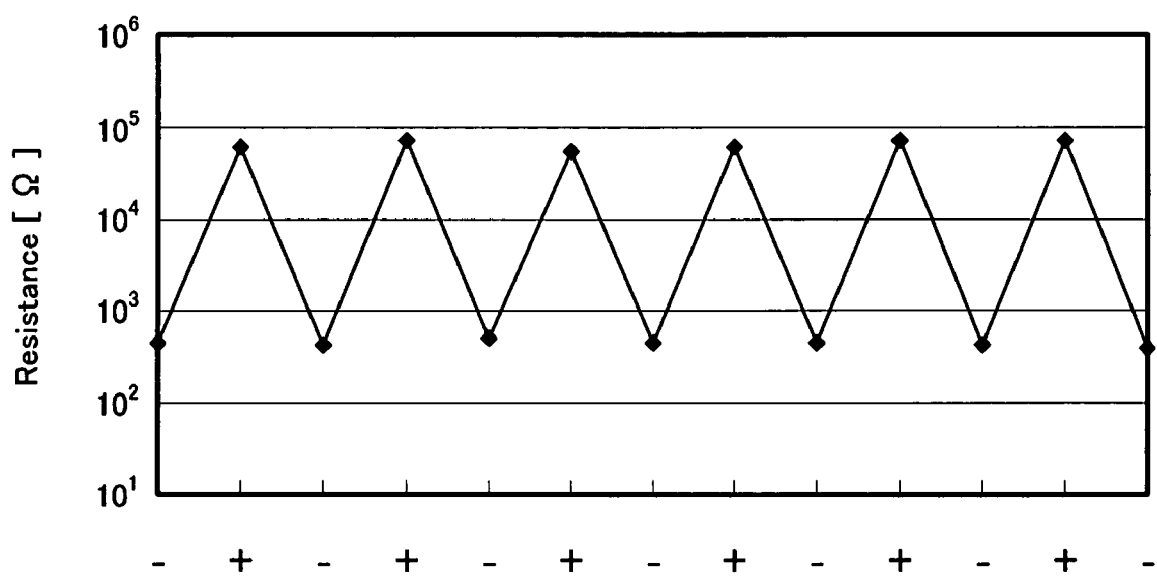
FIG. 5 is a diagram showing a writing profile of the variable resistor element in the semiconductor memory device of one embodiment according to the present invention.

FIG. 5 illustrates a switching profile (of the erasing action and the programming action) of the electric resistance with the application of voltage in the variable resistor element 21 of which the variable resistor 24 is made of an oxynitride including titanium. As shown in FIG. 5, the electric resistance of the variable resistor element 21 shifts from a low level to a high level (in the first writing action) when a positive voltage (as denoted by the plus sign in the drawing) based on a level at the upper electrode is applied to its lower electrode. In reverse, the electric resistance of the variable resistor element 21 returns back from the high level to the low level (in the second writing action) when a negative voltage (as denoted by the minus sign) based on a level at its upper electrode is applied to its lower electrode. As the polarity of the writing voltage to be applied to both ends of the variable resistor element 21 is alternated between the positive and the negative, the electric resistance of the variable resistor element 21 switches between the low resistance state and the high resistance state. This resistance state switching action allows the variable resistor element 21 to save a two-digit data (0 and 1) for the erasing and programming action.

Figure 6:
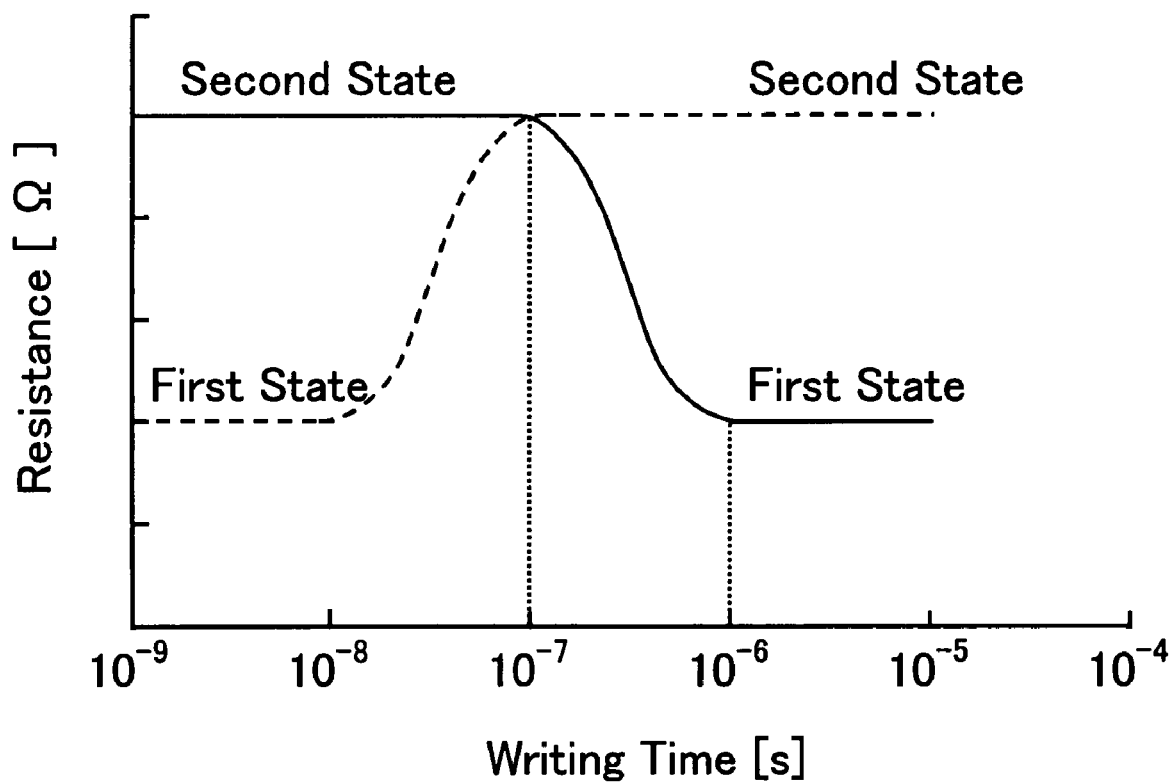
FIG. 6 is a diagram showing a writing time profile of the variable resistor element in the semiconductor memory device according to the first embodiment of the present invention.

The writing action including erasing and programming action of the inventive device will now be described in more detail. FIG. 6 is a time profile of the writing action showing an example of the relationship between the duration of time for applying the writing voltage to the variable resistor element and a change in the resistance of the variable resistor element. As shown in FIG. 6, the first writing action for shifting the resistance of the variable resistor element from the first state (the low resistance state) to the second state (the high resistance state) involves applying the first writing voltage for example, 3 V) of a pulsed form of which the pulse width is 100 nanoseconds (the first writing time) based on a level (0V) at the upper electrode which is the other end of the variable resistor element to the lower electrode which is one end of the variable resistor element. The second writing action for returning back the resistance of the variable resistor element from the second state (the high resistance state) to the first state (the low resistance state) involves applying the second writing voltage (for example, −3 V) of a pulsed form of which the pulse width is 1 microsecond (the second writing time) based on a level (0V) at the upper electrode which is the other end of the variable resistor element to the lower electrode which is one end of the variable resistor element. The pulse width representing the first writing time or the second writing time is a duration of time for actually applying the writing voltage of a pulsed form between both ends of the variable resistor element, which may be a sum of separate time slices of the application.

More specifically, the writing time profile of the variable resistor element shown in FIG. 6 is asymmetrical in the duration of time for shifting from one resistance state to the other (as different between the first writing time and the second writing time) depending on the polarity of the writing voltage to be applied to both ends of the variable resistor element. The asymmetrical profile between the two, positive and negative polarities is a phenomenon resulting from the fact that the lower electrode and the upper electrode which sandwich the variable resistor to form the variable resistor element are different from each other in either the material or the area size or that the variable resistor is not uniform in the thickness or that the interface between the upper electrode and the variable resistor is different in the requirement from the interface between the lower electrode and the variable resistor due to variations of the production process.

The writing action for conducting the erasing action on a group of the memory cells at once and then the programming action on a target memory cell will be explained. It is assumed in this embodiment the erasing action means the second writing action while the programming action means the first writing action. When the target memory cell is at its erased state, the electric resistance of its variable resistor element remains at the first state (the low resistance state). When the memory cell is at its programmed state, the electric resistance of its variable resistor element remains at the second state (the high resistance state).

The writing action of the inventive device involves erasing a group of the memory cells to be written at once and then subjecting the target memory cell to be programmed to the programming action (for shifting to the high resistance state). More particularly, the memory cells to be erased are subjected to no programming action. It is assumed that when the memory size to be written is 64 Kbytes or the number of the memory cells to be subjected to the programming action hold 64 Kbytes, the duration of time T1 (a total writing time) required for conducting the steps of the writing action is a sum of the time T1$e$ required for the erasing action and the time T1$p$ required for the programming action. The time T1$e$ requited for conducting the erasing action as the second writing action is 1 microsecond while the time T1$p$ required for programming one byte in the first writing action is 100 nanoseconds. As shown in Equation 3, the time T1 is hence about 52.43 milliseconds for writing 64 Kbytes. In this embodiment, a unit for conducting the erasing action at once (equivalent to a second memory cell number which is the number of memory cells to be subjected to the second writing action at once) is 64 Kbytes (64×1024×8 bits) while a unit for conducting the programming action (equivalent to a first memory cell number which is the number of memory cells to be subjected to the first writing action at once) is 1 bit.

$$T1 = T1e + T1p = 1\ \mu s + 100\ ns \times 64\ Kbytes = 52.43\ ms \quad (3)$$

When the definition is reversed between the erasing action and the programming action, the first writing action for shifting the electrical resistance of the variable resistor element from the first state (the low resistance state) to the second state (the high resistance state) represents the erasing action and the second writing action for shifting the same in a reverse represents the programming action. The duration of time T2 required for conducting the steps of the writing action (a total writing time) is about 524.29 milliseconds as denoted by Equation 4 which is substantially 10 times longer than that denoted by Equation 3.

$$T2 = T2e + T2p = 100\ ns + 1\ \mu s \times 64\ Kbytes = 524.29\ ms \quad (4)$$

The duration of time T3 (a total writing time) required for erasing and programming each target memory cell while not subjecting a group of the memory cells to the erasing action at once is 576.72 milliseconds as denoted by Equation 5, which is longer than T1 or T2.

$$T3 = T3e + T3p = (100\ ns + 1\ \mu s) \times 64\ Kbytes = 576.72\ ms \quad (5)$$

As described, the erasing action which represents either the first writing action or the second writing action is conducted at once over a group of the memory cells and the total writing time will hence be shorter than the subjecting of each memory cell to the erasing action. Further, when the profile of the writing time of the variable resistor element is asymmetrical as shown in FIG. 6, the total writing time can significantly be shortened by assigning either the first or second writing action which is longer in the time consumption (the second writing action in this embodiment) to the erasing action and subjecting a group of the memory cells to be written at once to the erasing action.

The asymmetrical profile of the writing action determined by the polarity of the writing voltage to be applied to both ends of the variable resistor element is not uniformly plotted with the orientation of the upper and lower electrodes but may be varied depending on the production process. Accordingly, when the erasing action is simply conducted at once over a group of the memory cells to be written with the electrical resistance of the variable resistor element remaining unchanged at either the first state (the low resistance state) or the second state (the high resistance state), the erasing action represented by either the first writing action or the second writing action is not always longer in the time consumption due to the architecture of the arrangement of the variable resistor element and the selecting transistor and the voltage to be applied to the bit lines and the source lines, hence hardly shortening the total writing time efficiently. The inventive device selects and assigns the second writing action which is longer in the time consumption as the erasing action and subjects a group of the memory cells to be written at once to the erasing action. As the result, the semiconductor memory device according to the present invention will be minimized in the total duration of time required for conducting the writing action.

In the above embodiment, the memory size to be written is as large as 64 Kbytes and equal to the unit size to be subjected at once to the erasing action. Alternatively, the group of the memory cells to be subjected to the erasing action may be assigned to those connected along one row or column and selected from each bit line or each word line (for example, 256 bits or 512 bits) or those selected from one or more combinations of word lines and bit lines. This allows the memory cells to be subjected at once to the erasing action, thus minimizing the total writing time.

For example, when the memory size to be subjected at once to the erasing action is 8 bits (the number of the memory cells being eight to be subjected at once to the erasing action), the total writing times T1 and T2 denoted by Equations 3 and 4 respectively are expressed by T1' (about 117.96 milliseconds) and T2' (about 530.84 milliseconds) as denoted by Equations 6 and 7 respectively.

$$T1' = T1e' + T1p' = 1\ \mu s \times 64\ Kbytes \div 8 + 100\ ns \times 64\ Kbytes = 117.96\ ms \quad (6)$$

$$T2' = T2e' + T2p' = 100\ ns \times 64\ Kbytes \div 8 + 1\ \mu s \times 64\ Kbytes = 530.84\ ms \quad (7)$$

As described above, even when the data unit to be subjected to the erasing action at once is smaller than the memory size to be written, the total writing time can be significantly shortened by assigning either the first or second writing action which is longer in the time consumption (the second writing action in this embodiment) to the erasing action and subjecting a group of the memory cells to be written at once to the erasing action.

When a rate of the memory cells determine by dividing a number of the memory cells to be subjected at once to the erasing action (which is equivalent to the second memory cell number) by a number of the memory cells to be subjected to the programming action (which is equivalent to the first memory cell number as being 1 in this embodiment) is greater than a rate of the writing time Rt (=1 $\mu s \div 100$ ns=10) determined by dividing the second writing time (1 microseconds) by the first writing time (100 nanoseconds), the time T1$e$ (T1$e'$) required for conducting the erasing action becomes shorter than the time T1$p$(T1$p'$) required for conducting the programming action. Accordingly, the number of the memory cells to be subjected at once to the erasing action is preferably greater than the writing time rate Rt (=10).

In this embodiment, the writing action comprises a step of erasing at once and a step of programming each. The writing action may be added with other steps of reading the stored data after the erasing step and the programming step (known as a combination of the erase verifying action and the program verifying action) and repeating the erasing action and the programming action on each memory cell which has failed to be erased and programmed correctly, while the advantage of the prevent invention remains not disturbed. The action of reading the stored data for the erase verifying action and the program verifying action is conducted separately of the erasing action and the programming action, regardless of the mode of the reading action whether the memory cells are read separately or at once. Since the time required for conducting the reading action is simply added to the total writing time, it will hardly interfere the minimization of the writing time.

Although the writing action comprises a step of erasing at once and a step of programming each in this embodiment and the programming step which follows the erasing step permits one bit of the data (equivalent to the first memory cell number) to be subjected to the programming action, two or more bits of the memory cells can be subjected at once to the programming action as well as the erasing action. Since the data unit (equivalent to the second memory cell number) to be subjected to the erasing action is set greater than the data unit (equivalent to the first memory cell number) to be subjected to the programming action, the duration of time required for conducting the second writing action which is longer in the time consumption (time T1e required for the erasing action) can positively be shortened thus minimizing the total writing time T1 efficiently.

The application of voltage to the word lines WL1 to WLm, the bit lines BL1 to BLn, and the source lines SL in the memory cell array 30 shown in FIG. 1 will be described for conducting the erasing action and the programming action in the writing action.

Figure 7:
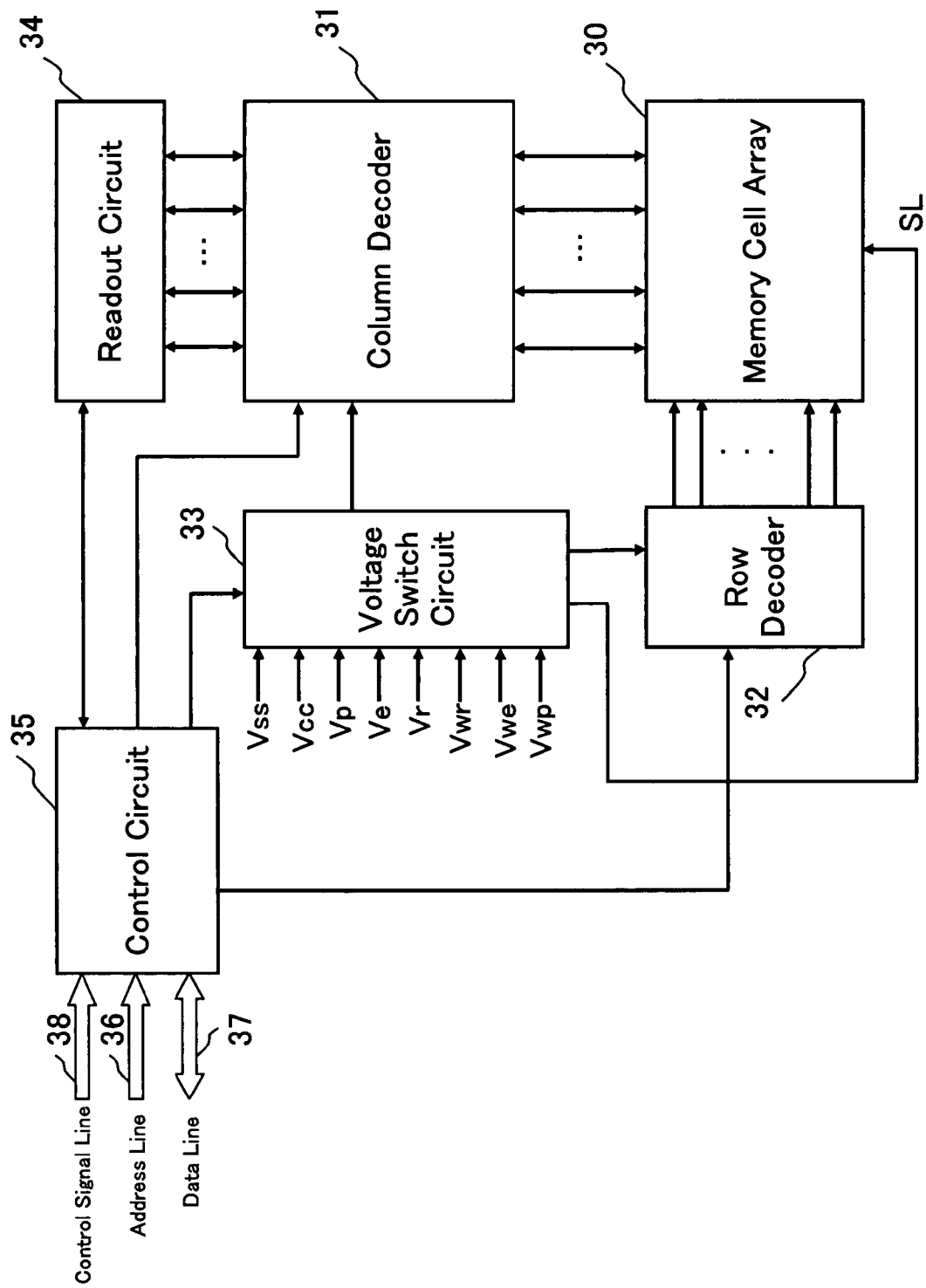
FIG. 7 is a block diagram schematically showing an arrangement of the semiconductor memory device according to one embodiment of the present invention.

The description starts with the peripheral circuits arranged for applying predetermined levels of voltage which will be explained later to the word lines WL1 to WLm, the bit lines BL1 to BLn, and the source lines SL. FIG. 7 schematically illustrates an arrangement of the peripheral circuits in the inventive device.

Figure 16:
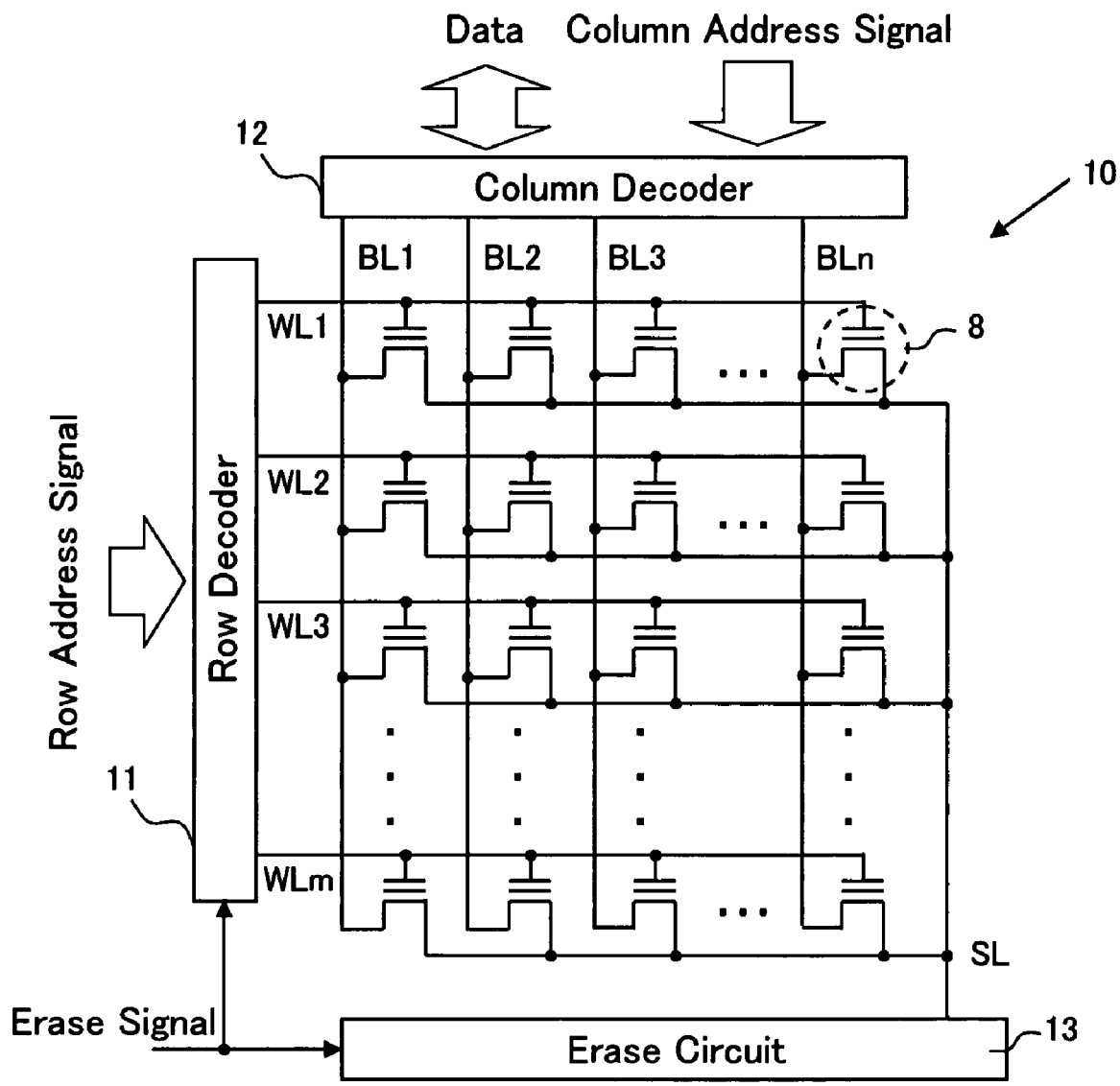
FIG. 16 is a circuitry diagram schematically showing an arrangement of an array of the memory cells shown in FIG. 15 and its peripheral circuits.
Figure 17:
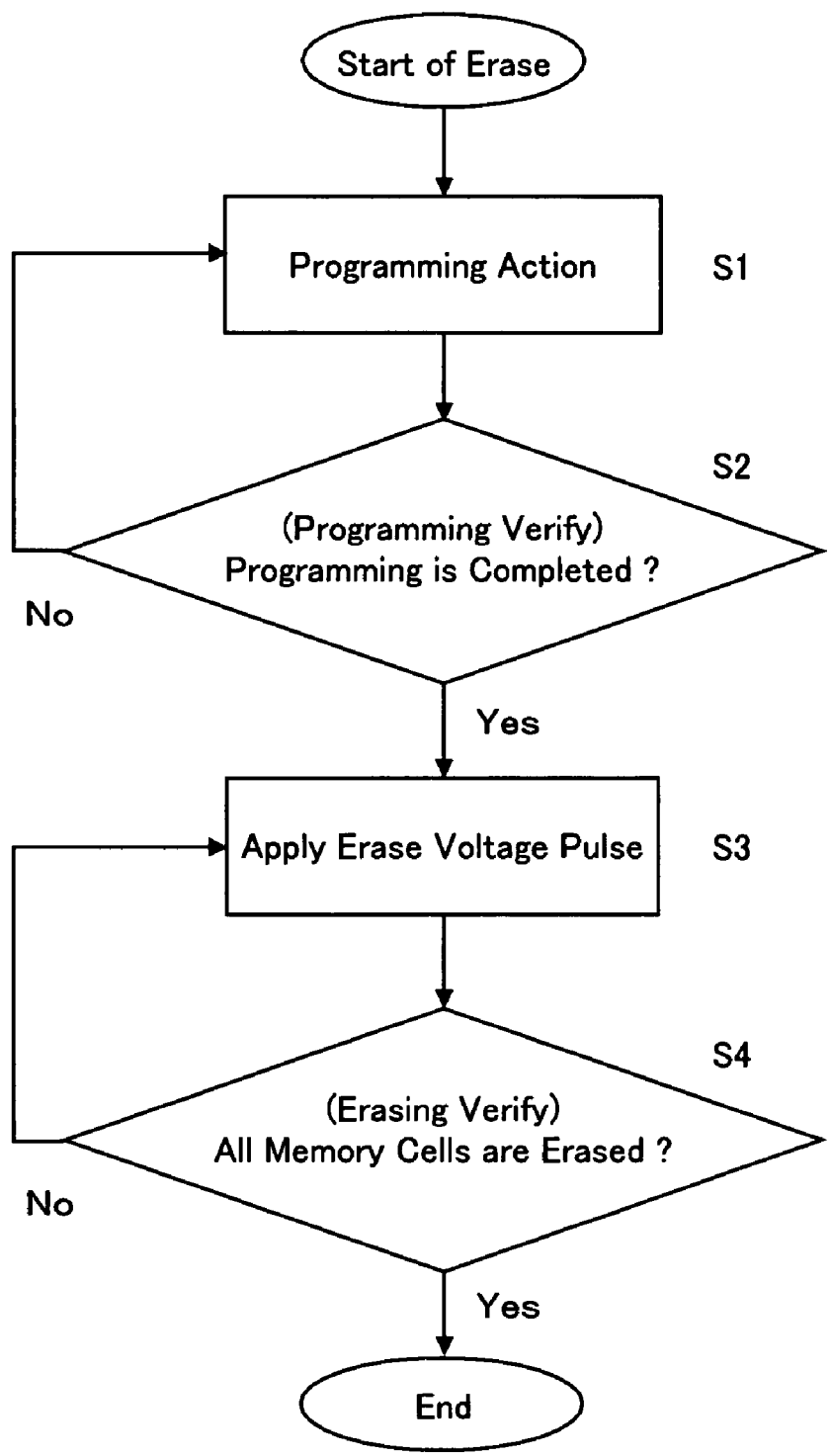
FIG. 17 is a flowchart showing a procedure of the erasing action in the flash memory.

As shown in FIG. 7, the inventive device includes a column decoder 31, a row decoder 32, a voltage switch circuit 33, a readout circuit 34, and a control circuit 35 installed about the memory cell array 30 shown in FIG. 1. Fundamentally, the peripheral circuits are similar to those in the conventional flash memory shown in FIG. 16.

In response to an address input of the control circuit 35 received from the address line 36, the column decoder 31 and the row decoder 32 are operated to select the memory cell in the memory cell array 30 to be subjected to the reading action, the programming action (the first writing action), or the erasing action (the second writing action). For a common reading action, the row decoder 32 selects the word line in the memory cell array 30 determined by the input signal from the address line 36 while the column decoder 31 selects the bit line in the memory cell array 30 determined by the input signal from the address line 36. For the programming action, the erasing action, and their relevant verifying actions, the row decoder 32 selects one or more of the word lines in the memory cell array 30 determined by a row address signal of the control circuit 35 while the column decoder 31 selects one or more of the bit lines in the memory cell array 30 determined by a column address signal of the control circuit 35. This allows the memory cell connected to the word line selected by the row decoder 32 and the bit line selected by the column decoder 31 to be selected.

The control circuit 35 controls the action of steps of the memory cell array 30 for the programming action, the erasing action (including the action of erasing at once), and the reading action. In response to the address signal from the address line 36, the data input from a data line 37 (at the writing mode), and the control input signal from a control signal line 38, the control circuit 35 controls the action of the row decoder 32, the column decoder 31, and the voltage switch circuit 33 to conduct the reading action, the erasing action, and the programming action at the memory cell array 30. In the circuitry arrangement shown in FIG. 7, the control circuit 35 has common functions of an address buffer circuit, a data input/output buffer circuit, and a control input buffer circuit which are not shown.

The voltage switch circuit 33 switches the voltages to be applied to the word lines (the selected word line and the unselected word lines), the bit lines (the selected bit line and the unselected bit lines), and the source lines for conducting each of the reading action, the erasing action, and the programming action at the memory cell array 30. More specifically, the selected word line and the unselected word lines receive a voltage via the row decoder 32 from the voltage switch circuit 33, the selected bit line and the unselected bit lines receive a voltage via the column decoder 31 from the voltage switch circuit 33, and the source lines receive a voltage directly from the voltage switch circuit 33. In FIG. 7, Vcc is the source voltage, Vss is the grounding voltage, Vr is the reading voltage, Vp is the programming voltage (the absolute value of the first writing voltage), Ve is the erasing voltage (the absolute value of the second writing voltage), Vwr is the selected word line voltage for conducting the reading action, Vwp is the selected word line voltage for conducting the programming action, and Vwe is the selected word voltage for conducting the erasing action. When the programming voltage Vp (for conducting the programming action) and the erasing voltage Ve (or conducting the erasing action) are equal to each other, they may be used in a common manner. When the selected word line voltage Vwp for conducting the programming action and the selected word line voltage Vwe for conducting the erasing action are equal to each other, they may be used in a common manner.

The readout circuit 34 compares directly with a reference current a readout current which flows from the selected bit line determined by the column decoder 31 via the selected memory cell to the source line or converts the readout current into a readout voltage and compares the readout voltage with a reference voltage in order to judge the state of the stored data (the resistance state) before its judgment is dispatched to the control circuit 35 and is output to the data line 37.

Figure 8:
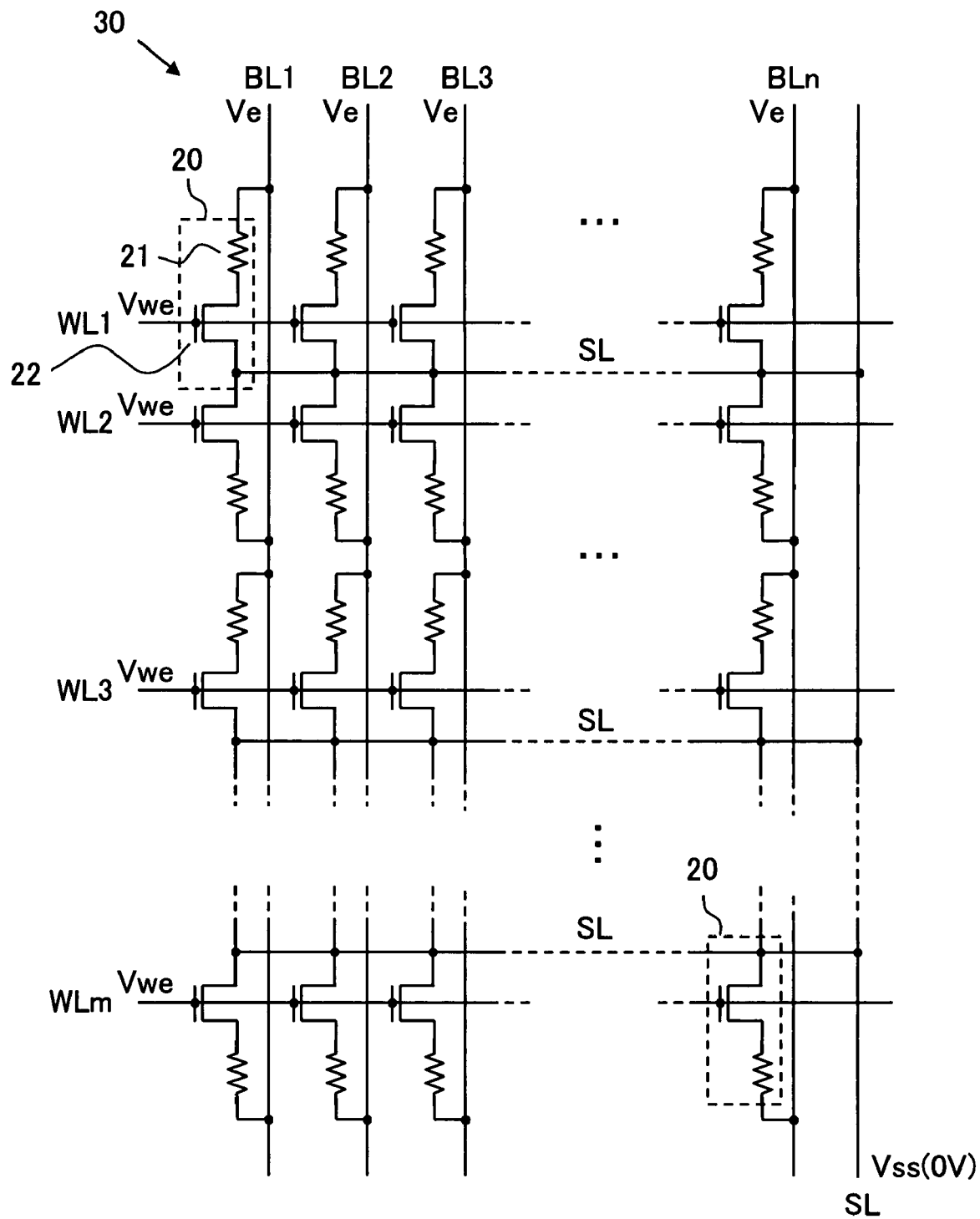
FIG. 8 is a view of a requirement for applying the voltage to conduct the erasing action (the second writing action) of the semiconductor memory device according to the first embodiment of the present invention.

The requirement of applying the voltage for subjecting the memory cell array 30 at once to the erasing action will now be explained. For erasing the memory cell array 30 at once, all the word lines WL1 to WLm are selected by the row decoder 32 and receive the selected word line voltage Vwe (for example, 3 V), as shown in FIG. 8. Simultaneously, all the bit lines BL1 to BLn are selected by the column decoder 31 and receive the erasing voltage Ve (for example, 3 V). The source lines SL are connected with 0 V (the grounding voltage Vss). This allows the selecting transistor of each memory cell to be turned on. The grounding voltage at 0 V of the source lines SL is received by the lower electrode of the variable resistor element while the erasing voltage Ve (for example, 3 V) is applied to the upper electrode of the variable resistor element from one of the bit lines BL1 to BLn. More particularly, the variable resistor element receives at its lower electrode a negative voltage (−Ve) based on a level at its upper electrode. Accordingly, all the memory cells are subjected to the second writing action shown in FIG. 6 where the resistance of the variable resistor element in each memory cell shifts from the second state (the high resistance state) to the first state (the low resistance state). The pulse width of the pulsed erasing voltage Ve (the second writing time) is determined by an overlapping of the duration of time for applying the selected word line voltage Vwe to the word lines WL1 to WLm and the duration of time for applying the erasing voltage Ve to the bit lines BL1 to BLn. Accordingly, either the selected word line voltage Vwe or the erasing voltage Ve may be applied earlier than the other or disconnected earlier than the other.

For subjecting at once a group of the memory cells in the memory cell array 30 which, for example, are connected along one or more rows to the erasing action, one or more of the word lines in the corresponding rows are selected. The selected word lines receive the selected word line voltage Vwe while the unselected word lines are connected to 0 V (the grounding voltage Vss). This allows the selecting transistor of each memory cell connected to the selected word line to be turned on. The variable resistor element hence receives at its lower electrode a negative voltage (−Ve) based on a level at its upper electrode. Accordingly, the selected memory cells along one or more rows in the memory cell array 30 can be erased at once. For desirably selecting some of the word lines, the row decoder 32 may be modified to have a function for the purpose.

Also for subjecting at once a group of the memory cells in the memory cell array 30 which, for example, are connected along one or more columns to the erasing action, one or more of the bit lines in the corresponding columns are selected. The selected bit lines receive the erasing voltage Ve while the unselected bit lines are connected to 0 V (the grounding voltage Vss) or held at the floating state (at high impedance). Accordingly, the variable resistor element in each selected memory cell connected to the selected bit line receives at its lower electrode a negative voltage (−Ve) based on a level at its upper electrode. As the result, the selected memory cells along one or more columns in the memory cell array 30 can be erased at once. For desirably selecting some of the bit lines, the column decoder 31 may be modified to have a function for the purpose.

Moreover for subjecting at once a group of the memory cells in the memory cell array 30 which, for example, are connected along one or more rows and one or more columns to the erasing action, one or more of the word lines in the corresponding rows are selected and receive the selected word line voltage Vwe while the unselected word lines are connected to 0 V (the grounding voltage Vss). At the same time, one or more of the bit lines in the corresponding columns are selected and receive the erasing voltage Ve while the unselected bit lines are connected to 0 V (the grounding voltage Vss) or held at the floating state. Accordingly, the variable resistor element in each selected memory cell to be erased at once receives at its lower electrode a negative voltage (−Ve) based on a level at its upper electrode. As the result, the selected memory cells along the desired rows and columns in the memory cell array 30 can be erased at once.

As explained, the action of erasing at once is added with the steps of reading the stored data after the erasing action (for verifying the erasing action) and repeating the erasing action over the memory cells which have been erased not correctly. However, when the memory cells not erased are selectively subjected to the erasing action, the number of the erasing actions for each memory cell increases. Accordingly, the total writing time will be increased until the action of erasing all the memory cells to be selected is completed. For compensation, all the memory cells to be erased may repeatedly be subjected at once to the erasing action. Alternatively, when some of the memory cells including the not erased memory cells are selectable from one or more rows, one or more columns, or a combination of rows and columns, they can be subjected at once to the erasing action under the voltage applying condition equal to the above described action of erasing at once the selected memory cells in the memory cell array 30.

Figure 9:
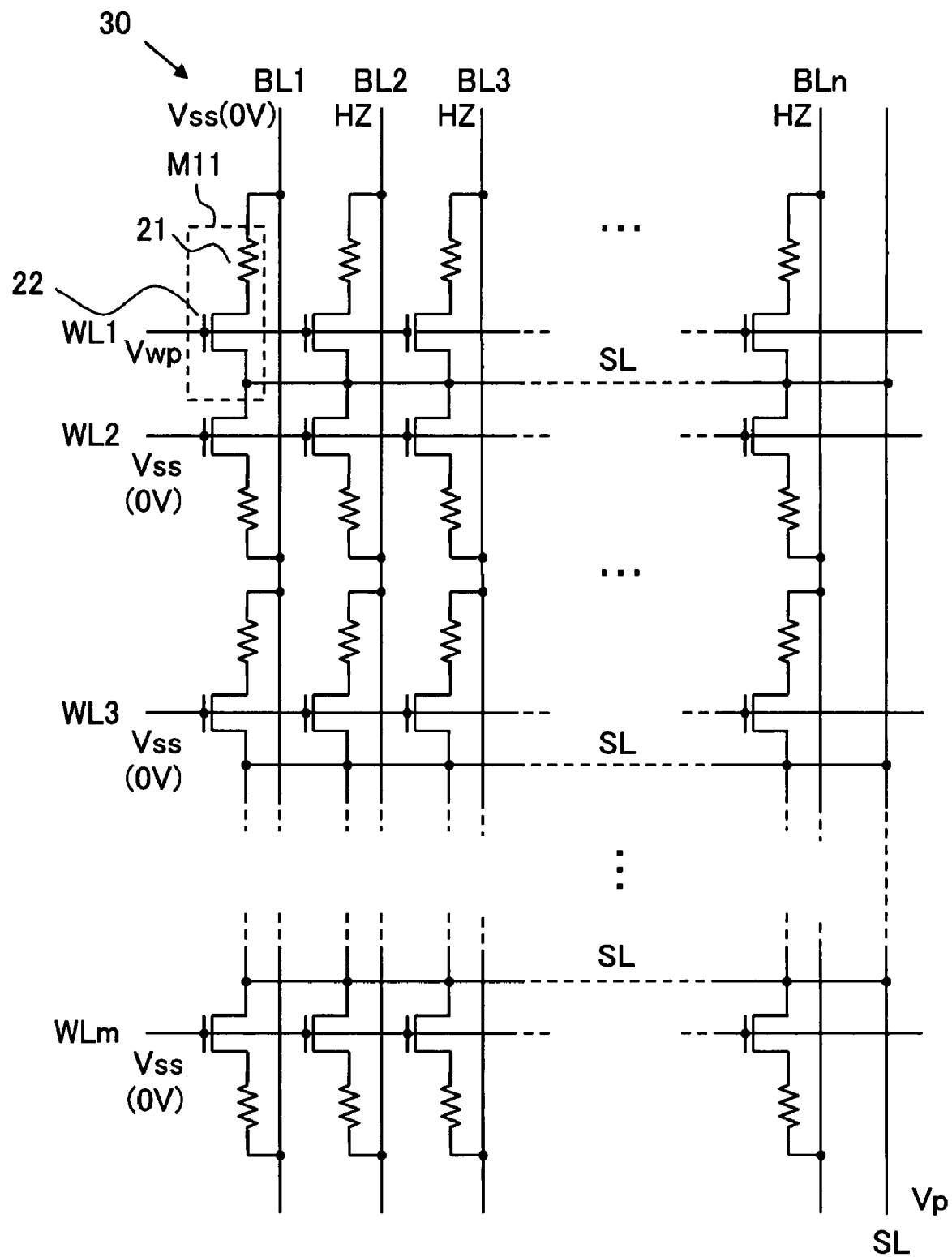
FIG. 9 is a view of a requirement for applying the voltage to conduct the programming action (the first writing action) of the semiconductor memory device according to the first embodiment of the present invention.

The requirement of applying the voltage for subjecting the memory cells in the memory cell array 30 one by one to the programming action (the first writing action) will be described. For programming the memory cells one by one or, for example, the memory cell M11 connected with the word line WL1 and the bit line BL1, as shown in FIG. 9, the word line WL1 is selected as a selected word line by the row decoder 32 and receives the selected word line voltage Vwp (for example, 3 V) while the unselected word lines WL2 to WLm are connected to 0 V (the grounding voltage Vss). Simultaneously, the bit line BL1 is selected as a selected bit line by the column decoder 31 and connected to 0 V (the grounding voltage Vss) while the unselected bit lines BL2 to BLn remain at the floating state (at a high impedance). Also, the programming voltage Vp (for example, 3 V) is applied to the source line SL. This allows the selecting transistor in the selected memory cell M11 to be turned on. The programming voltage Vp applied to the source line SL is transferred across the selecting transistor to the lower electrode of the variable resistor element, provided that it is not higher than a difference voltage (Vwp−Vth) determined by subtracting the threshold voltage (Vth) of the selecting transistor from the gate voltage (Vwp) of the selecting transistor. At the same time, the upper electrode of the variable resistor is connected via the bit line BL1 to 0 v (the grounding voltage Vss). Accordingly, the variable resistor element of the selected memory cell M11 receives at its lower electrode a positive voltage (Vwp−Vth) based on a level at its upper electrode. As the selected memory cell M11 has been subjected to the first writing action shown in FIG. 6, the resistance of its variable resistor element shifts from the first state (the low resistance state) to the second state (the high resistance state).

The programming voltage Vp can be applied to both ends of the variable resistor element when the selected word line voltage Vwp is higher than a sum of the programming voltage Vp and the threshold voltage (Vth). When the selected word line voltage Vwp is lower than the sum of the programming voltage Vp and the threshold voltage (Vth), the programming voltage (the absolute value of the first writing voltage) to be applied to both ends of the variable resistor element of the selected memory cell M11 drops down, thus increasing the duration of time required for conducting the programming action (the first writing time). It is therefore desirable for minimizing the selected word line voltage Vwp and avoiding a drop in the voltage by the level of the threshold at the on state to set the threshold voltage (Vth) of the selecting transistor to as a low level as possible, provided that the off-leak current is sufficiently suppressed at the off state (with the gate voltage at 0 V). In this embodiment, the threshold voltage is favorably set with 0.5 V to 1 V, for example.

The pulse width of the pulsed form of the programming voltage (the first writing time) is determined by an overlapping of the duration of time for applying the selected word line voltage Vwp to the selected word line WL1 and the duration of time for applying the programming voltage Vp to the source line SL. Accordingly, either the selected word line voltage Vwp or the programming voltage Vp may be applied earlier than the other or disconnected earlier than the other.

As for the requirement of applying the voltage for subjecting a group of the memory cells in the memory cell array 30 at once to the programming action (the first writing action), the memory cells to be subjected at once to the programming action are connected along one row or column. For programming at once, for example, a group of the memory cells connected along one row, the selected word lines are selected by the row decoder 32 and receive the selected word line voltage Vwp for example, 3 V) while the unselected word lines are connected to 0 V (the grounding voltage Vss), similar to the action for subjecting each memory cell to the programming action. Simultaneously, the bit lines connected to the group of the memory cells to be subjected to the programming action are selected by the column decoder 31 and connected to 0 V (the grounding voltage Vss) while the unselected bit lines remain at the floating state (at a high impedance). Also, the programming voltage Vp (for example, 3 V) is applied to the source lines SL. This allows the selected memory cells to be programmed to receive at the lower electrode a positive voltage (Vwp−Vth) based on a level at the upper electrode. As the selected memory cells have been subjected to the first writing action shown in FIG. 6, the resistance of their variable resistor elements shifts from the first state (the low resistance state) to the second state (the high resistance state). Alternatively, for subjecting a group of the memory cells connected along one row to the programming action, the word lines connected to the memory cells to be programmed are selected as selected word lines by the row decoder 32 and receive the selected word line voltage Vwp (for example, 3 V) while the unselected word lines are connected to 0 V (the grounding voltage Vss). Simultaneously, the selected bit lines selected by the column decoder 31 are connected to 0 V (the grounding voltage Vss) while the unselected bit lines remain at the floating state (at a high impedance). Also, the programming voltage Vp (for example, 3 V) is applied to the source lines SL. This allows the selected memory cells to be programmed to receive at the lower electrode a positive voltage (Vwp−Vth) based on a level at the upper electrode. As the selected memory cells have been subjected to the first writing action shown in FIG. 6, the resistance of their variable resistor elements shifts from the first state (the low resistance state) to the second state (the high resistance state).

Figure 10:
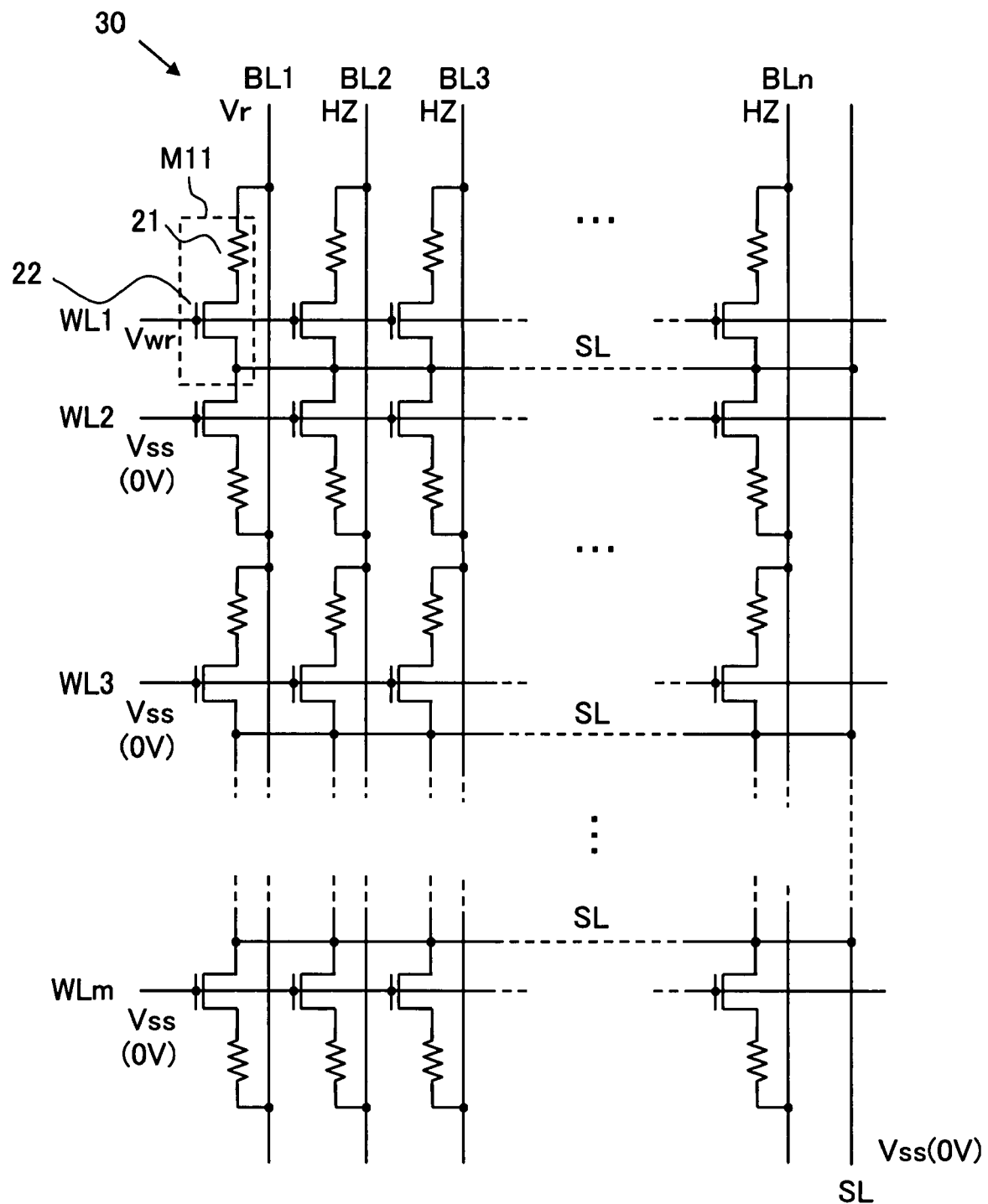
FIG. 10 is a view of a requirement for applying the voltage to conduct the reading action of the semiconductor memory device according to the first embodiment of the present invention.

The requirement of applying the voltage for subjecting the memory cells in the memory cell array 30 one by one to the reading action will be described. For reading the memory cells one by one or, for example, the memory cell M11 connected with the word line WL1 and the bit line BL1, as shown in FIG. 10, the word line WL1 is selected as a selected word line by the row decoder 32 and receives the selected word line voltage Vwr (for example, 1.5 V) while the unselected word lines WL2 to WLm are connected to 0 V (the grounding voltage Vss). Simultaneously, the bit line BL1 is selected as a selected bit line by the column decoder 31 and receives the readout voltage Vr (for example, 1 V) while the unselected bit lines BL2 to BLn remain at the floating state (at a high impedance). Also, the source line SL is connected to 0 V (the grounding voltage Vss). This allows the selecting transistor in the selected memory cell M11 to be turned on. While the grounding voltage Vss of 0 V at the source line SL is connected across the selecting transistor to the lower electrode of the variable resistor element, the readout voltage Vr (for example, 1 V) is applied to the upper electrode of the variable resistor from the bit line BL1. Accordingly, the readout current flows from the upper electrode to the lower electrode of the variable resistor element in the selected memory cell M11 depending on the resistance state of the variable resistor element and further from the selected bit line BL1 to the source line SL. As the result, the readout current can be received via the column decoder 31 by the readout circuit 34 which thus reads out a corresponding data from the selected memory cell M11. It would be understood that the requirement of applying the voltage for subjecting the memory cells to the reading action are applicable with equal success to the verifying action accompanied with the programming action and the erasing action.

Second Embodiment

The second embodiment of the present invention will now be described. In the above first embodiment, assuming that the variable resistor element 21 of the memory cell 20 in the memory cell array 30 shown in FIG. 1 is arranged to have the writing profile shown in FIG. 5 and the writing time profile shown in FIG. 6, the requirements for applying voltage are described about the cases where some or entire of the memory cells in the memory cell array 30 are subjected at once to the erasing action and where the memory cells in the memory cell array 30 are subjected one by one to the programming action. This embodiment is different from the first embodiment in the requirements for applying voltage since both the writing profile and the writing time profile are not equal to those of the first embodiment.

Figure 11:
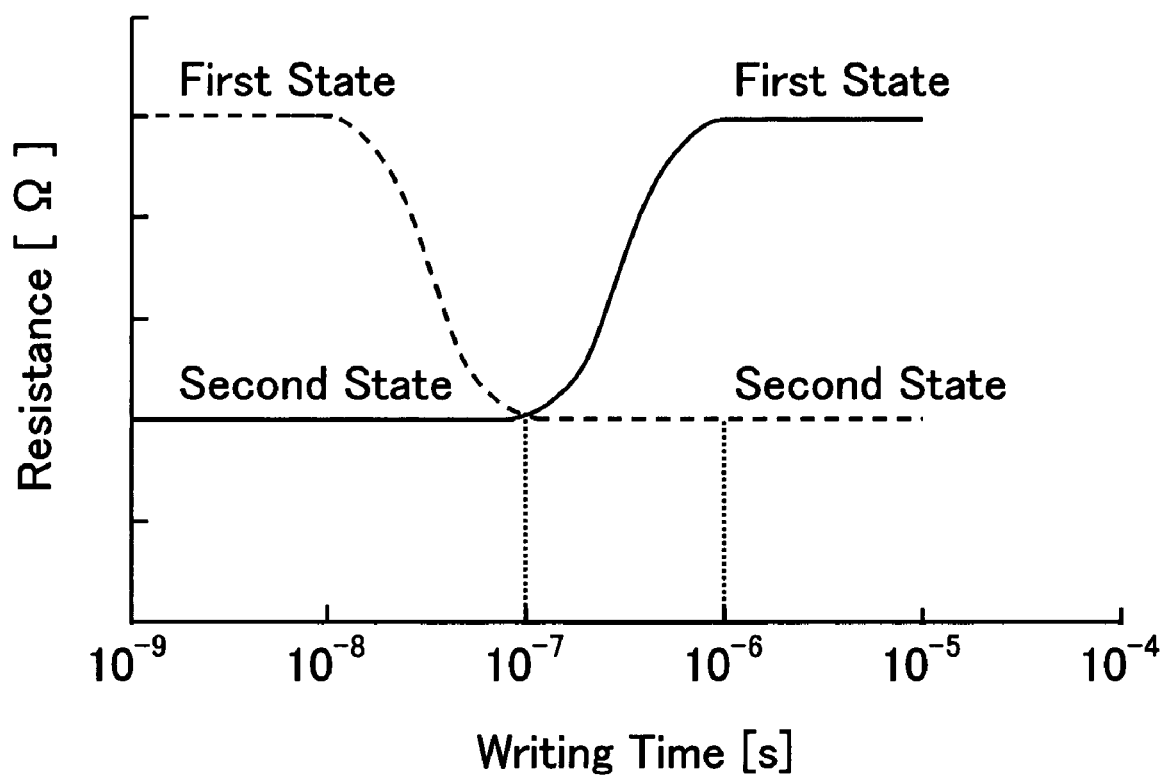
FIG. 11 is a diagram schematically showing a writing time profile of the variable resistor element in a semiconductor memory device according to the second embodiment of the present invention.

It is now assumed that the memory cell array, its peripheral circuits, and the writing profile (the relationship between the polarity of the applying voltage and a change in the resistance) of its variable resistor element 21 are equal to those of the first embodiment shown in FIGS. 1, 7, and 5. As clearly shown in FIG. 11, the writing time profile of the variable resistor element 21 is different from that of the first embodiment. The requirement of applying the voltage will be described for subjecting some or entire of the memory cells in the memory cell array 30 at once to the erasing action and for subjecting the memory cells in the memory cell array 30 one by one to the programming action. The arrangements of the memory cell array, its peripheral circuits, and the other which are equal to those of the first embodiment will be explained in no more detail.

The second writing action of the second embodiment for shifting the resistance of the variable resistor element from the second state (the low resistance state) to the first state (the high resistance state) involves applying the second writing voltage (for example, 3 V) of a pulsed form of which the pulse width (the second writing time) is 1 microsecond based on a level (0 V) at the upper electrode which is the other end of the variable resistor element to the lower electrode which is one end of the variable resistor element. The first writing action for shifting the resistance of the variable resistor element from the first state (the high resistance state) to the second state (the low resistance state) involves applying the first writing voltage (for example, −3 V) of a pulsed form of which the pulse width (the first writing time) is 100 nanoseconds based on a level (0V) at the upper electrode to the lower electrode of the variable resistor element. More particularly, the first and second states of the resistance of the variable resistor element in the first embodiment are inverted in this embodiment. The writing profile shown in FIG. 5 remains substantially unchanged. Also, the first and second writing voltages in the first embodiment are inverted in the polarity in this embodiment. In the second embodiment, the second writing action or the erasing action involves shifting the resistance of the variable resistor element from the low resistance state to the high resistance state while the first writing action or the programming action involves shifting the resistance of the variable resistor element from the high resistance state to the low resistance state.

Figure 12:
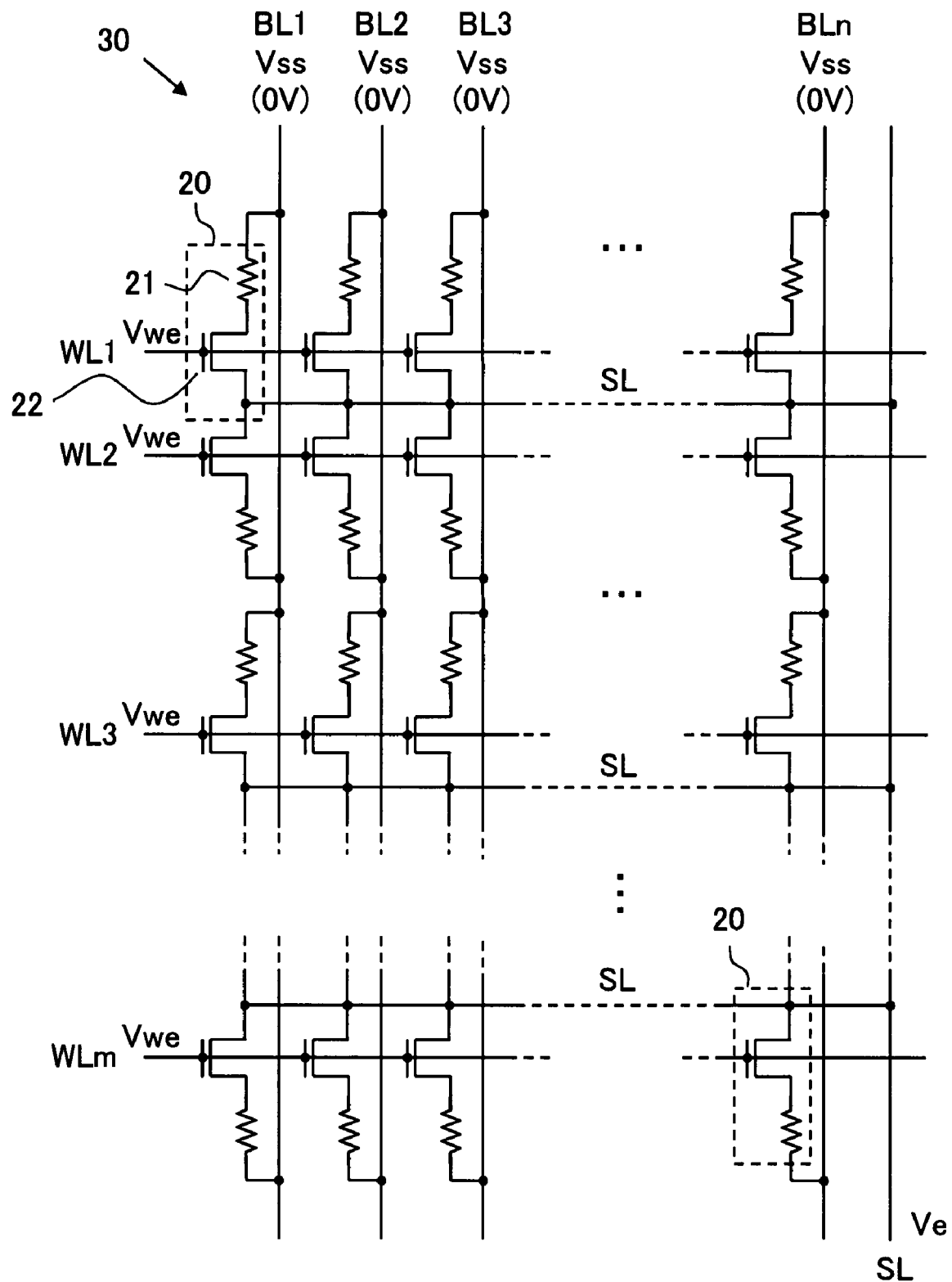
FIG. 12 is a view of a requirement for applying the voltage to conduct the erasing action (the second writing action) of the semiconductor memory device according to the second embodiment of the present invention.

The requirement of applying the voltage for subjecting the memory cell array 30 at once to the erasing action will be described. For erasing the memory cell array 30 at once, all the word lines WL1 to WLm are selected as selected word lines by the row decoder 32 and receive the selected word line voltage Vwe (for example, 3 V), as shown in FIG. 12. Simultaneously, all the bit lines BL1 to BLn are selected as selected bit lines by the column decoder 31 and connected to 0 V (the grounding voltage Vss). The erasing voltage Ve (for example, 3 V) is applied to the source lines SL. This allows the selecting transistor of each memory cell to be turned on. The erasing voltage Ve (for example, 3 V) applied to the source line SL is transferred across the selecting transistor to the lower electrode of the variable resistor element, provided that it is not higher than a difference voltage (Vwe−Vth) determined by subtracting the threshold voltage (Vth) of the selecting transistor from the gate voltage (Vwe) of the selecting transistor. At the same time, the upper electrode of the variable resistor is connected via each of the bit lines BL1 to BLn to 0 v (the grounding voltage Vss). Accordingly, the variable resistor element receives at its lower electrode a positive voltage (Vwe−Vth) based on a level at its upper electrode. As all the memory cells have been subjected to the second writing action shown in FIG. 11, the resistance of its variable resistor element shifts from the second state (the low resistance state) to the first state (the high resistance state).

The erasing voltage Ve can be applied to both ends of the variable resistor element when the selected word line voltage Vwe is higher than a sum of the erasing voltage Ve and the threshold voltage (Vth). When the selected word line voltage Vwe is lower than the sum of the erasing voltage Ve and the threshold voltage (Vth), the erasing voltage (the absolute value of the second writing voltage) to be applied to the variable resistor element of each memory cell drops down, thus increasing the duration of time required for conducting the erasing action (the second writing time). It is therefore desirable for minimizing the selected word line voltage Vwe and avoiding a drop in the voltage by the level of the threshold at the on state to set the threshold voltage (Vth) of the selecting transistor to as a low level as possible, provided that the off-leak current is sufficiently suppressed at the off state (with the gate voltage at 0 V). In this embodiment, the threshold voltage is favorably set with 0.5 V to 1 V, for example.

When the selected word line voltage Vwe and the erasing voltage Ve are equal to each other, the writing time for conducting the erasing action will increase due to a drop in the actual erasing voltage applied to both ends of the variable resistor element. Dissimilar to the first embodiment, the erasing action is carried out at once over a group of the memory cells even when the duration of time required for conducting the erasing action, which is longer in the time consumption, is increased. Accordingly, the effect of delay over each memory cell is reduced to a fragment as divided by the number of the memory cells (the second memory cell number) to be erased at once. In other words, as the writing time required for conducting the erasing action (the second writing time) is longer than that required for conducting the programming action (the first writing time) due to a drop in the actual erasing voltage by the threshold level of the selecting transistor, the erasing action will favorably be implemented by the writing action where the threshold voltage of the selecting transistor is largely affected.

The pulse width of the pulsed form of the erasing voltage Ve (the second writing time) is determined by an overlapping of the duration of time for applying the selected word line voltage Vwe to the word lines WL1 to WLm and the duration of time for applying the erasing voltage Ve to the source lines SL. Accordingly, either the selected word line voltage Vwe or the erasing voltage Ve may be applied earlier than the other or disconnected earlier than the other.

For erasing a group of the memory cells in the memory cell array 30 at once, more particularly, a group of the memory cells connected to one or more rows, one or more of the word lines connected to the row to be erased are selected and receive the selected word line voltage Vwe while the unselected word lines are connected to 0 V (the grounding voltage Vss). This allows the selecting transistors in the selected memory cells connected to the selected word lines to be turned on. Accordingly, the variable resistor element of the selected memory cell connected to the selected word line receives at the lower electrode a positive voltage (Vwe−Vth) based on a level at the upper electrode, whereby the group of the memory cells in the memory cell array 30 can be erased at once along one or more rows.

For erasing a group of the memory cells in the memory cell array 30 at once, more particularly, a group of the memory cells connected to one or more columns, one or more of the bit lines connected to the column to be erased are selected and connected to 0 V (the grounding voltage Vss) while the unselected bit lines receive the positive voltage (Vwe−Vth). Accordingly, the variable resistor element of the selected memory cell connected to the selected bit line receives at the lower electrode the positive voltage (Vwe−Vth) based on a level at the upper electrode, whereby the group of the memory cells in the memory cell array 30 can be erased at once along one or more columns.

For erasing a group of the memory cells in the memory cell array 30 at once, more particularly, a group of the memory cells connected to one or more combinations of rows and columns, one or more of the word lines connected to the row to be erased are selected and receive the selected word line voltage Vwe while the unselected word lines are connected to 0 V (the grounding voltage Vss). Similarly, one or more of the bit lines connected to the column to be erased are selected and connected to 0 V (the grounding voltage Vss) while the unselected bit lines receive the positive voltage (Vwe−Vth). Accordingly, the variable resistor element of the selected memory cell to be erased receives at the lower electrode the positive voltage (Vwe−Vth) based on a level at the upper electrode, whereby the group of the memory cells in the memory cell array 30 can be erased at once along one or more combinations of rows and columns.

Figure 13:
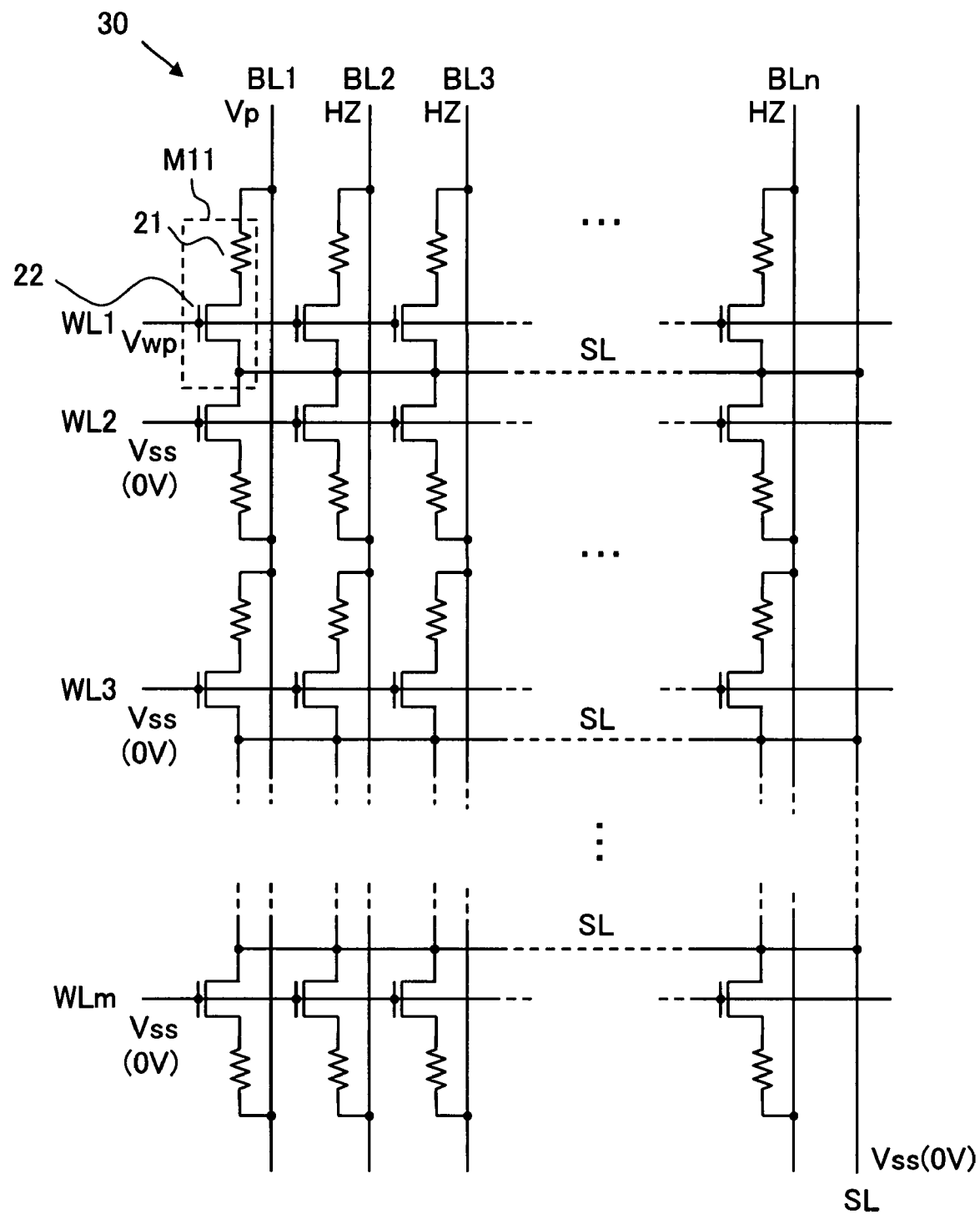
FIG. 13 is a view of a requirement for applying the voltage to conduct the programming action (the first writing action) of the semiconductor memory device according to the second embodiment of the present invention.

The requirement of applying the voltage for subjecting the memory cells in the memory cell array 30 one by one to the programming action (the first writing action) will be described. For programming the memory cells one by one or, for example, the memory cell M11 connected with the word line WL1 and the bit line BL1 to the programming action, as shown in FIG. 13, the word line WL1 is selected as a selected word line by the row decoder 32 and receives the selected word line voltage Vwp (for example, 3 V) while the unselected word lines WL2 to WLm are connected to 0 V (the grounding voltage Vss). Simultaneously, the bit line BL1 is selected as a selected bit line by the column decoder 31 and receives the programming voltage Vp (for example, 3 V) while the unselected bit lines BL2 to BLn remain at the floating state (at a high impedance). Also, the source line SL is connected to 0 V (the grounding voltage Vss). This allows the selecting transistor in the selected memory cell M11 to be turned on. The grounding voltage at 0 V applied to the source line SL is transferred across the selecting transistor to the lower electrode of the variable resistor element while the programming voltage Vp (for example, 3 V) is applied across the bit line BL1 to the upper electrode of the variable resistor element. Accordingly, the variable resistor element of the selected memory cell M11 receives at its lower electrode a negative voltage (−Vp) based on a level at its upper electrode. As the selected memory cell M11 has been subjected to the first writing action shown in FIG. 11, the resistance of its variable resistor element shifts from the first state (the high resistance state) to the second state (the low resistance state). The pulse width of the pulsed form of the programming voltage (the first writing time) is determined by an overlapping of the duration of time for applying the selected word line voltage Vwp to the word line WL1 and the duration of time for applying the programming voltage Vp to the bit line BL1. Accordingly, either the selected word line voltage Vwp or the programming voltage Vp may be applied earlier than the other or disconnected earlier than the other.

The requirement of applying the voltage for subjecting a group of the memory cells in the memory cell array 30 at once to the programming action (the first writing action) is equal to that of the first embodiment, provided that the memory cells of the group are connected along one row or column.

Since the reading action is also equal to that of the first embodiment and it is not affected by the writing time profile, its description will be omitted.

Third Embodiment

The third embodiment of the present invention will be described. As described previously, the writing action of the first embodiment involves erasing at once all the memory cells to be written or repeatedly erasing at once some of the memory cells to be written, and subjecting desired ones of the erased memory cells to the programming action. However, the storage state (the resistance state of the variable resistor element) is not always uniform before the action of erasing at once the memory cells to be written. When the voltage is applied to the variable resistor elements which are different in the resistance state at the initial stage under the same condition for the erasing action, they may be varied in the erased state (at the first state of the electric resistance). Accordingly, when subjected to the programming action, the variable resistor elements will furthermore be varied in the programmed state (at the second state of the electrical resistance), hence possibly interrupting the reading action after the completion of the writing action.

Figure 14:
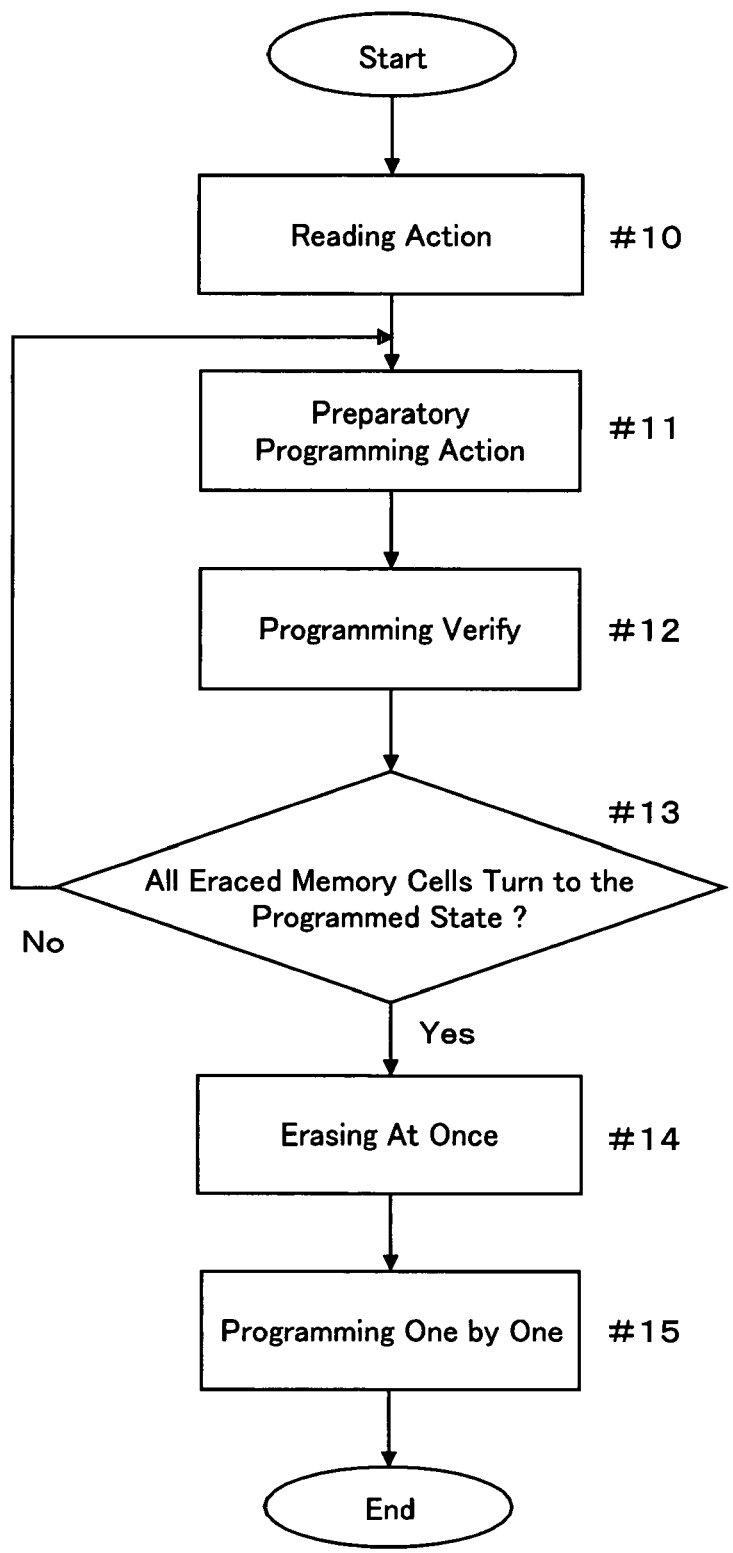
FIG. 14 is a flowchart showing a procedure of the action of writing data in a semiconductor memory device according to the third embodiment of the present invention.
Figure 15:
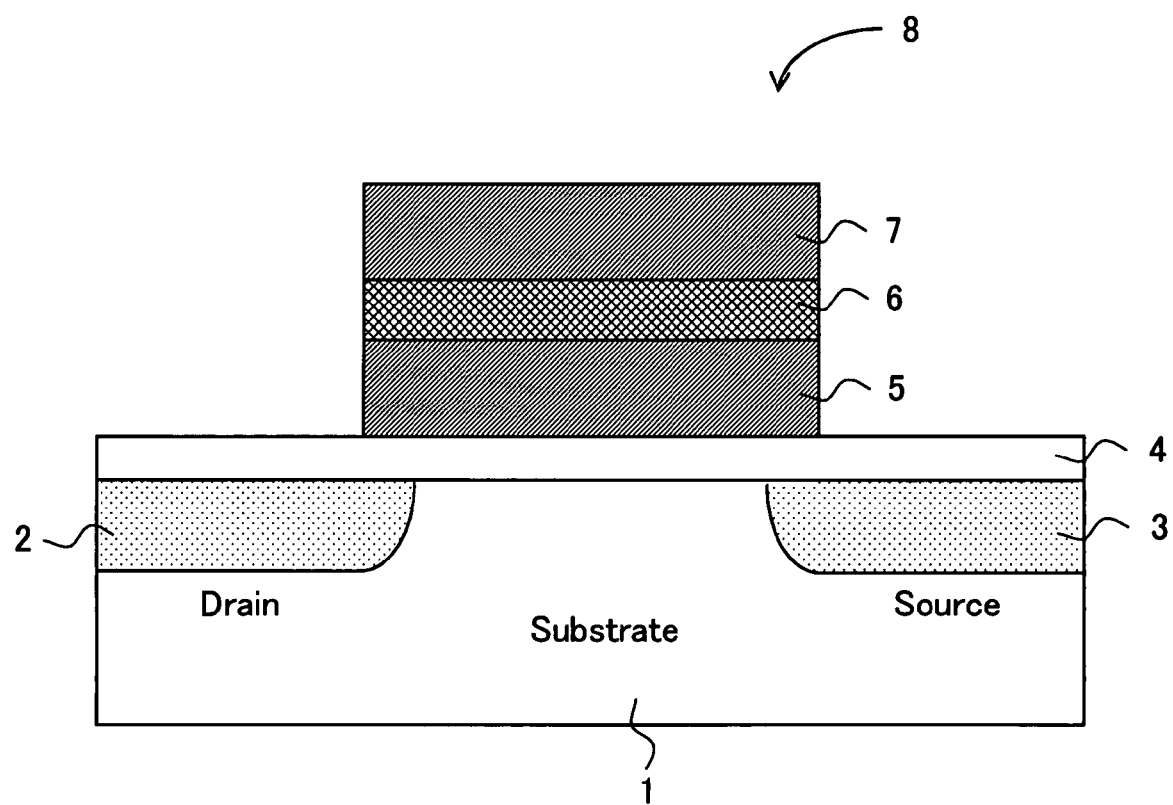
FIG. 15 is a cross sectional view schematically showing the cross section of a structure of the memory cell in a flash memory.

The third embodiment is arranged for minimizing the variations in the erased state of the variable resistor elements as shown in FIG. 14, before the action of erasing at once, involving detecting a memory cell which is at the erased state through the reading action (Step #10), subjecting the memory cell which is at the erased state to a preparatory programming action (Step #11), subjecting, after the preparatory programming action, the memory cell to a programming verifying action which is substantially equivalent to the reading action of Step #10 (Step #12), and repeating the preparatory programming action of Step #11 over all the memory cell which are at the erased state until particular ones of the memory cells which are not at the programmed state turn to the programmed state (Step #13). When the preparatory programming action over all the memory cells which were at the erased state has been completed (yes at Step #13), the procedure goes to the action of erasing at once (Step #14). The action of erasing at once is followed by subjecting some of the memory cells to be programmed one by one to the programming action (Step #15) and the procedure of the writing action is closed. As the action of erasing at once at Step #14 and the action of programming one by one at Step #15 are previously described with the first and second embodiments, its further description will be omitted. The reading action at Step #10 and the programming verifying action at Step #12 are equivalent to the reading action of the first embodiment.

It is not necessary that the preparatory programming action at Step #11 is carried out one by one over the memory cells. For example, the memory cells at the erased state connected along one word line may be subjected at once to the programming action. In this case, the requirement of applying the voltage (in the first embodiment) shown in FIG. 9 and the requirement of applying the voltage (in the second embodiment) shown in FIG. 13 are satisfied by the column decoder 31 selecting two or more of the bit lines. In practice, the column decoder 31 may be added with a function for selecting a desired number of the bit lines.

OTHER EMBODIMENTS

Other embodiments of the present invention will be described.

(1) The memory cell 20 and the memory cell array 30 in each of the foregoing embodiments are contemplated in the arrangement as shown in the plan view of FIG. 3 and the cross sectional view of FIG. 4. The memory cell 20 and the memory cell array 30 are not limited to those arrangements shown. Alternatively, the contact hole 47 provided above the impurity diffused layer 45 of the selecting transistor 22 may be connected to the bit line BL (BL1 to BLn) which extends along the column (in the Y direction) but not the source line while the upper electrode 25 of the variable resistor element 21 extends along either the row (in the X direction) or the column (in the Y direction) thus to form the source line SL. In this case, the memory cell array 30 is as shown in the equivalent circuit of FIG. 2. It is also noted that since the polarity of the voltage to be applied to between the source line SL and the bit line BL is opposite to that of the foregoing embodiments between the upper electrode 25 and the lower electrode 23 of the variable resistor element 21, the relationship between the first embodiment and the second embodiment are-reversed. More specifically, when the variable resistor element has the writing time profile shown in FIG. 6, the applying of the voltage to the word lines WL1 to WLm, the bit lines BL1 to BLn, and the source lines SL is determined by the requirement described with the second embodiment. When the variable resistor element has the writing time profile shown in FIG. 11, the applying of the voltage is determined by the requirement described with the first embodiment.

(2) In each of the foregoing embodiments, the arrangement with one memory cell array 30 is illustrated for ease of the description. The number of the memory cell arrays 30 is not limited to one but may be two or more. The advantage of the writing time profile according to the present invention can be shared by all the memory cell arrays 30. The action of erasing at once may be conducted over two or more of the memory cell arrays.

(3) As described previously in each of the foregoing embodiments, the erasing action (the second writing action) and the programming action (the first writing action) are conducted with the opposite polarities of the voltage applied to both ends of the variable resistor element. In case that the erasing action (the second writing action) and the programming action (the first writing action) are equal to each other in the polarity but not the level of the voltage applied to both ends of the variable resistor element, the advantage of minimizing the writing time like that of each of the foregoing embodiments can be guaranteed by having the second writing time of the erasing action (the second writing action) set longer than the first writing time of the programming action (the first writing action).

The present invention is applicable to a semiconductor memory device which includes an array of memory cells arranged in rows and columns, each memory cell comprising a variable resistor element for storing a data by changing its electrical resistance in response to applying of a voltage accompanied with a selecting transistor, and favorable for speeding up the action of writing data on the memory cell array.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:

a memory cell array having a plurality of memory cells arranged in rows and columns, each memory cell including a variable resistor element of a two-port structure capable of storing a data by shifting an electric resistance from a first state to a second state when a first writing voltage is applied to both ends of the variable resistor element and shifting the electric resistance from the second state to the first state when a second writing voltage is applied to both ends of the variable resistor element, and a selecting transistor connected at either its source or drain to one end of the variable resistor element, wherein the memory cell has such a writing time characteristic that a second writing time required for shifting the electric resistance from the second state to the first state by applying the second writing voltage is longer than a first writing time required for shifting the electric resistance from the first state to the second state by applying the first writing voltage, a second number of the memory cells subjected at once to a second writing action of shifting the electric resistance from the second state to the first state is greater than a first number of the memory cells subjected at once to a first writing action of shifting the electric resistance from the first state to the second state when some or entire of the memory cells in the memory cell array are selected, and at least the second number of the memory cells is two or more between the first number and the second number of the memory cells.

2. The semiconductor memory device according to claim 1, wherein a memory cell number rate determined by dividing the second number of the memory cells by the first number of the memory cells is set equal to or greater than a writing time rate determined by dividing the second writing time by the first writing time.

3. The semiconductor memory device according to claim 1, wherein each of the first number of the memory cells and the second number of the memory cells is two or more.

4. The semiconductor memory device according to claim 1, wherein an absolute value of the first writing voltage is greater than an absolute value of the second writing voltage.

5. The semiconductor memory device according to claim 4, wherein the memory cell array includes a number of word lines extending along the rows and a number of bit lines extending along the columns, a gate of the selecting transistor in each of the memory cells arranged along one row is connected with a common word line while the variable resistor element in each of the memory cells arranged along one column is connected at the other end not connected to either the source or drain of the selecting transistor with the common bit line or either the source or drain of the selecting transistor not connected to one end of the variable resistor element is connected with the common bit line, the selecting transistor is an N channel MOSFET, and a positive voltage based on a level at either the source or drain of the selecting transistor not connected to one end of the variable resistor element in the memory cell to be written is applied to the other end of the variable resistor element not connected to either the source or drain of the selecting transistor in the memory cell to be written when the first writing voltage is applied to the memory cell to be written.

6. The semiconductor memory device according to claim 5, wherein the first writing voltage and the second writing voltage are different to each other in the polarity, and a negative voltage based on a level at either the source or drain of the selecting transistor not connected to one end of the variable resistor element in the memory cell to be written is applied to the other end of the variable resistor element not connected to either the source or drain of the selecting transistor in the memory cell to be written when the second writing voltage is applied to the memory cell to be written.

7. The semiconductor memory device according to claim 1, wherein the first writing action is preliminarily conducted for setting the electric resistance to the second state before the memory cells to be written are subjected simultaneously to the second writing action based on a writing control procedure provided in advance.

8. The semiconductor memory device according to claim 7, wherein the second number of the memory cells to be subjected at once to the second writing action is subjected to the reading action for retrieving the memory cells of which the electric resistance is not at the second state before the first writing action is preliminarily conducted, and the retrieved memory cells are preliminarily subjected to the first writing action based on a writing control procedure provided in advance.

* * * * *